(12) United States Patent
Kijima et al.

(10) Patent No.: US 7,266,007 B2
(45) Date of Patent: Sep. 4, 2007

(54) DEVICE STRUCTURE OF FERROELECTRIC MEMORY AND NONDESTRUCTIVE READING METHOD

(75) Inventors: Takeshi Kijima, Nagano (JP); Yasuaki Hamada, Nagano (JP)

(73) Assignee: Seiko Epson Corporation (JP)

( * ) Notice: Subject to any disclaimer, the term of this patent is extended or adjusted under 35 U.S.C. 154(b) by 72 days.

(21) Appl. No.: 11/089,365

(22) Filed: Mar. 24, 2005

(65) Prior Publication Data

US 2005/0213364 A1 Sep. 29, 2005

(30) Foreign Application Priority Data

Mar. 26, 2004 (JP) ............... 2004-092718

(51) Int. Cl.
*G11C 11/22* (2006.01)
(52) U.S. Cl. ............ 365/145; 365/117; 365/173
(58) Field of Classification Search ........... 365/149
See application file for complete search history.

(56) References Cited

U.S. PATENT DOCUMENTS

| | | | |
|---|---|---|---|
| 2,922,143 A | * | 1/1960 | Epstein ............. 365/191 |
| 3,733,590 A | * | 5/1973 | Kaufman ............ 365/117 |
| 5,578,845 A | * | 11/1996 | Masuda et al. ....... 257/295 |
| 6,016,267 A | * | 1/2000 | Bozso et al. ......... 365/145 |

FOREIGN PATENT DOCUMENTS

| | | |
|---|---|---|
| JP | 05-055664 | 3/1993 |
| JP | 05-129622 | 5/1993 |
| JP | 06-275062 | 9/1994 |

* cited by examiner

*Primary Examiner*—Thong Q. Le
(74) *Attorney, Agent, or Firm*—Harness, Dickey & Pierce, P.L.C.

(57) ABSTRACT

A method for reading a nondestructive readout type ferroelectric memory device including a process in which 1-bit data is written in a pair of a cell for storage and a cell for reference disposed in series in the ferroelectric memory device, and a process in which a response obtained when a pulse is impressed to the 1-bit data written in the pair of a cell for storage and a cell for reference is resonated by a resonant circuit with a specified resonance frequency provided at a readout side to thereby output an output signal to be nondestructively readout.

9 Claims, 21 Drawing Sheets

DAMPING FACTOR $\quad \zeta = \dfrac{C_2(R_1+R_2)}{2\sqrt{C_1 C_2 R_1 R_2}}$

CUT-OFF FREQUENCY $\quad f_c = 1/(2\pi\sqrt{C_1 C_2 R_1 R_2})$

FIG. 11
WL1
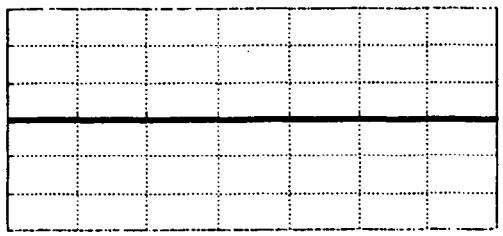
WL2
BL1
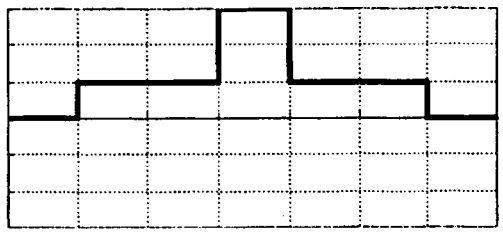
BL2
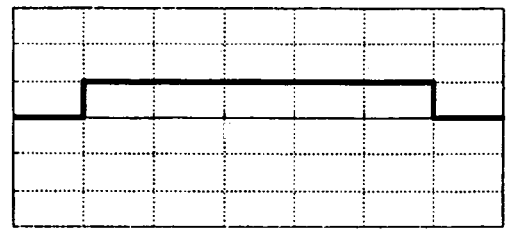
FIG. 12
C11
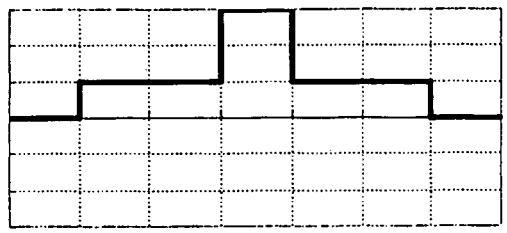
C12
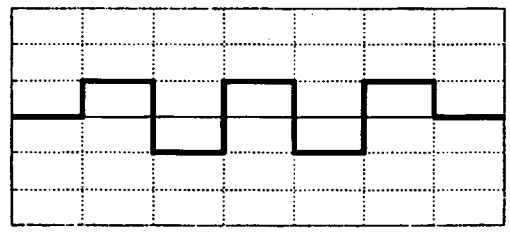
C21
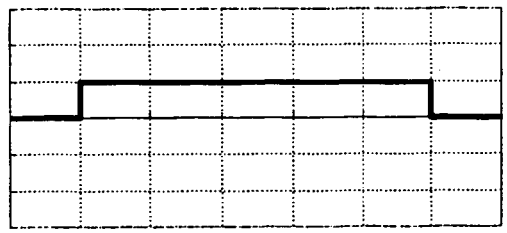
C22
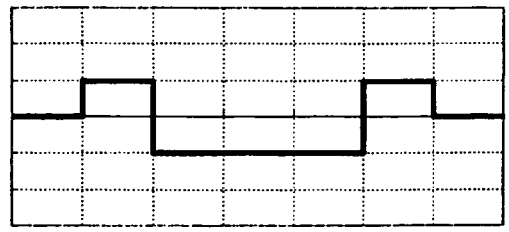

FIG. 13
C11
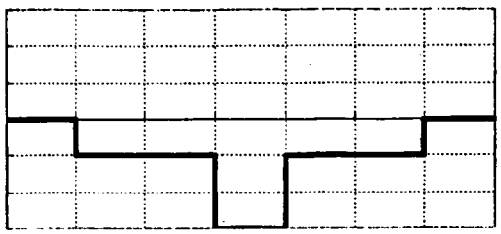
C12
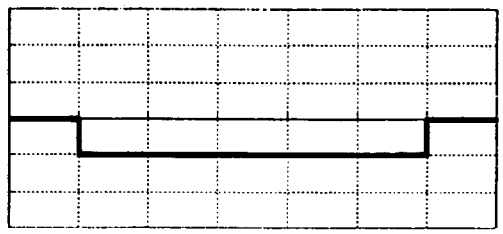
C21
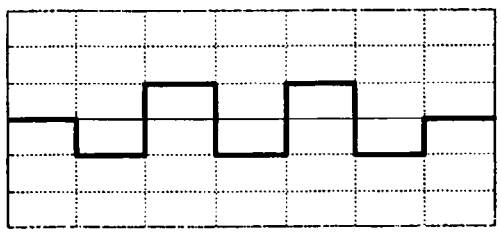
C22
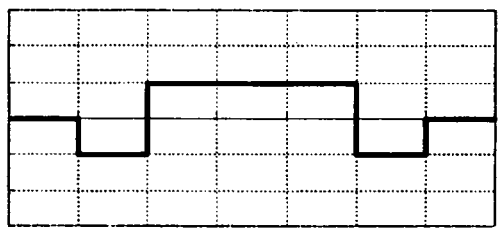
FIG. 14
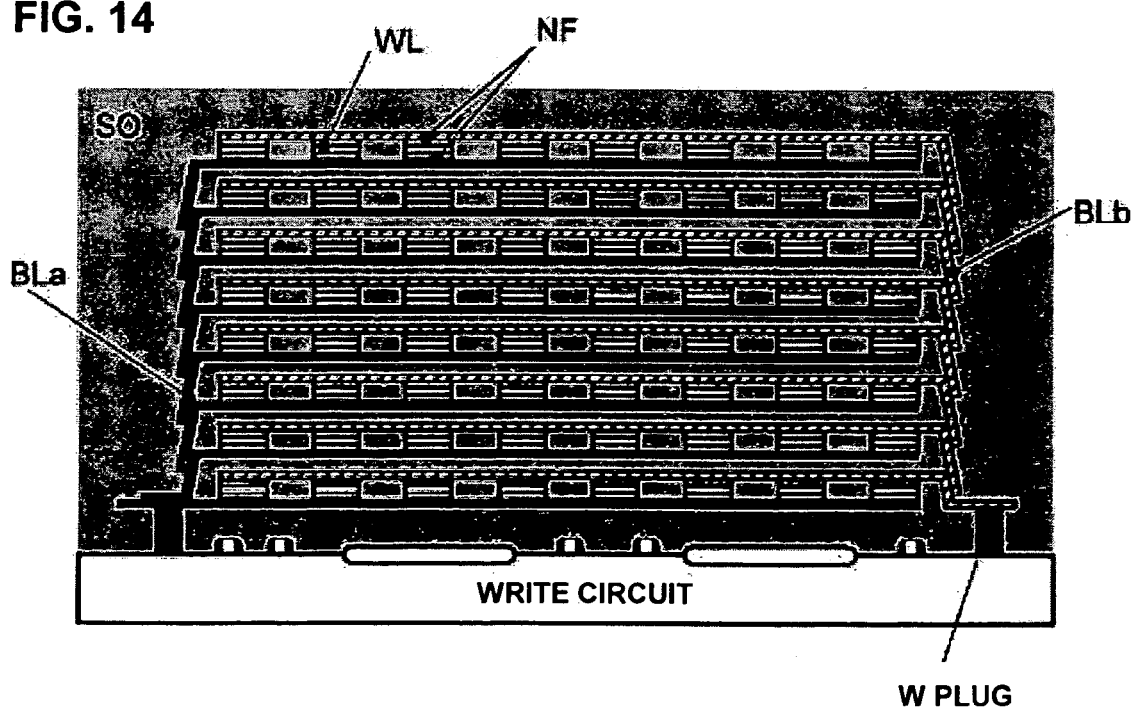

LAMINATED TYPE CROSS POINT CELL

READOUT CIRCUIT

WRITE CIRCUIT

FIG. 20
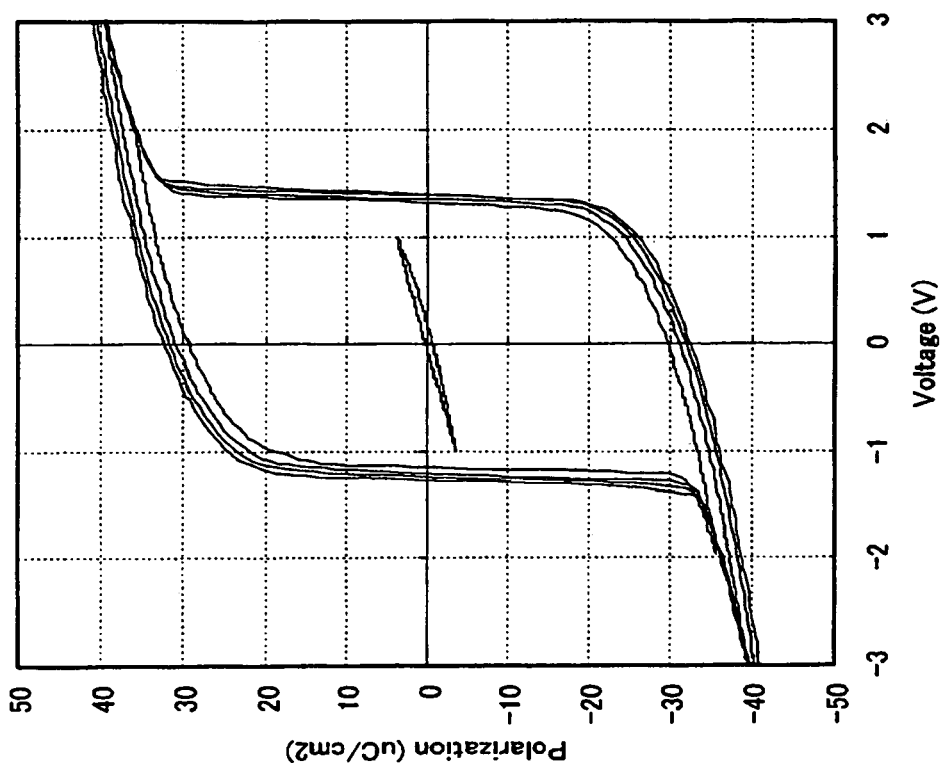
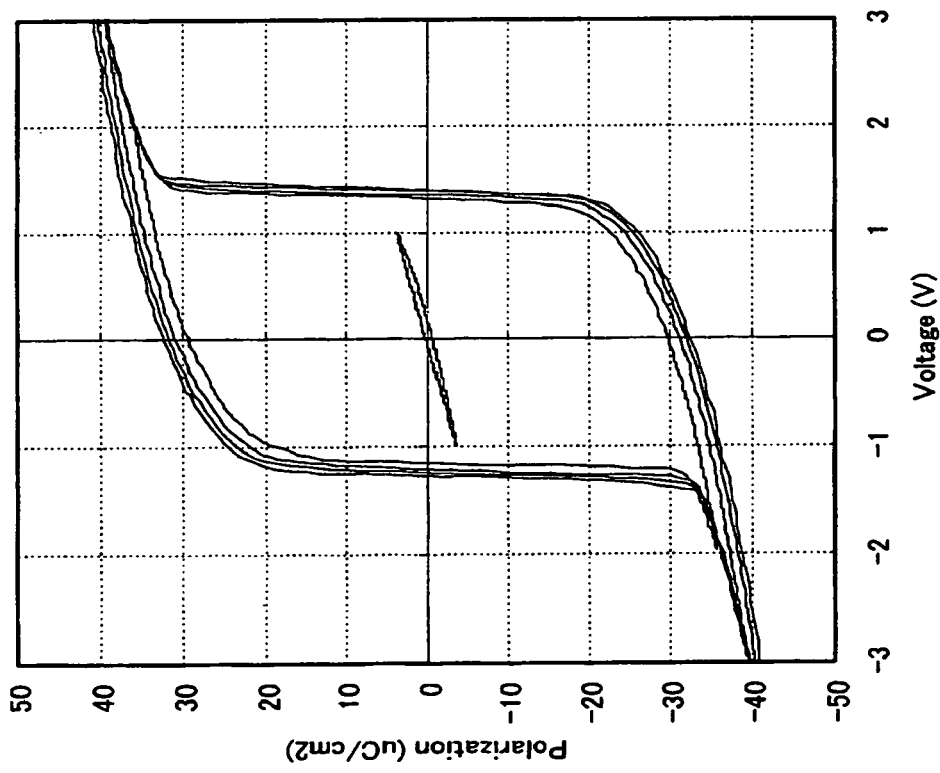

FM MODULATED READOUT SIGNAL

FM DEMODULATED READOUT SIGNAL

"0"

"1"

RESONANCE FREQUENCY

TIME

① PRECHARGE TO "0" OR "1" BY APPLYING +3V OR -3V

② EVALUATE RESPONSE BY APPLYING Sin WAVE OF MINUTE AMPLITUDE (0.2V ~)

FIG. 28a (PRIOR ART)
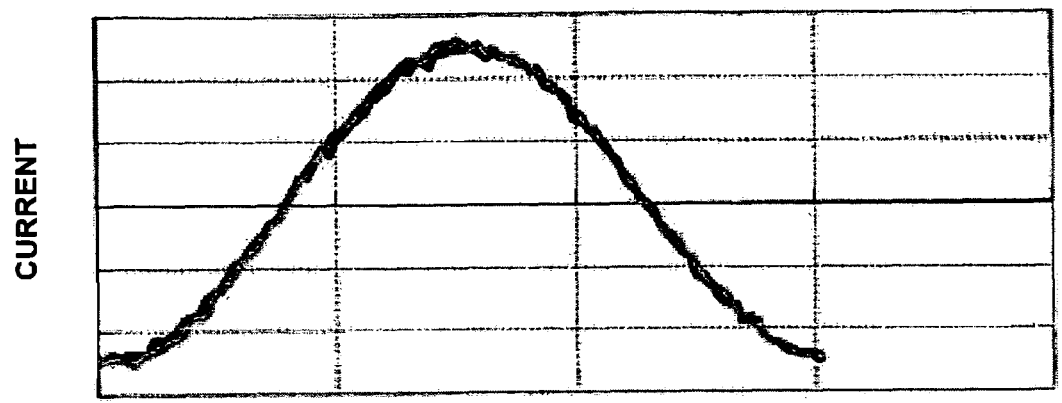
FIG. 28b (PRIOR ART) TIME
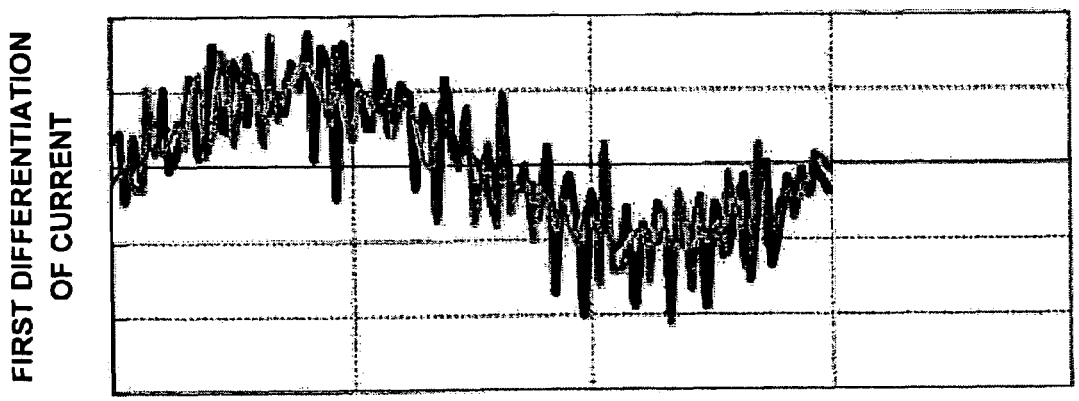
FIG. 28c (PRIOR ART) TIME
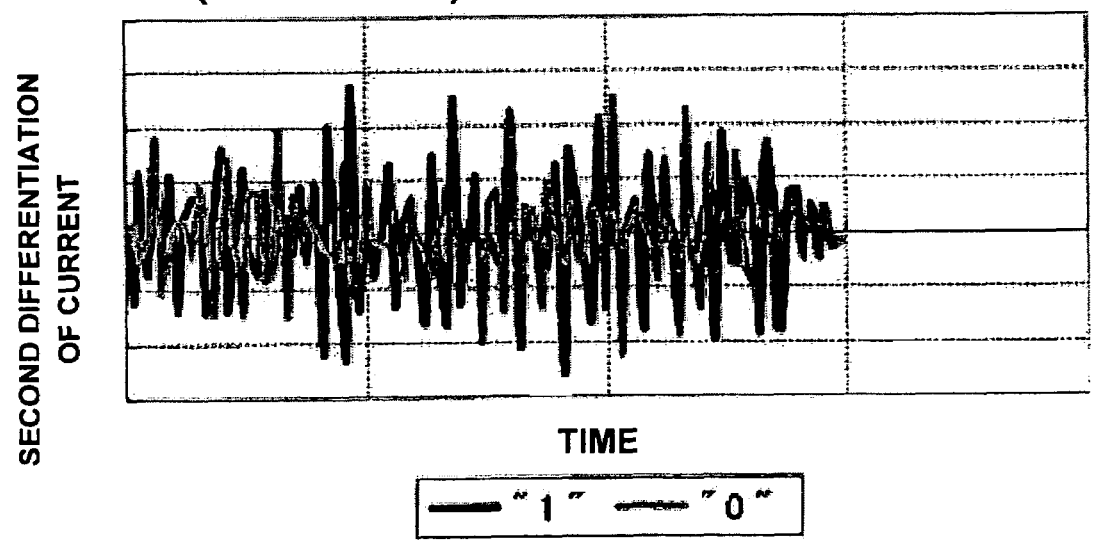

DEVICE STRUCTURE OF FERROELECTRIC MEMORY AND NONDESTRUCTIVE READING METHOD

RELATED APPLICATIONS

This application claims priority to Japanese Patent Application No. 2004-092718 filed Mar. 26, 2004 which is hereby expressly incorporated by reference herein in its entirety.

BACKGROUND

1. Technical Field

The present invention relates to a ferroelectric memory in which hysteresis characteristics of remanence polarization of ferroelectric are used for data retention, and more particularly to a nondestructive readout ferroelectric memory.

2. Related Art

It is generally known that a ferroelectric material has a hysteresis characteristic, and a ferroelectric memory using such a characteristic can be formed to store data. Conventionally, in the method of reading these memories, a destructive readout that uses polarization reversal currents, which requires rewriting of a memory cell that is selected to be read out, is performed. In this case, there are problems of lowered readout speed and fatigue due to the existence of rewriting operations, which causes a bottleneck as disadvantage to flash memories. Therefore, nondestructive readout methods have been examined. However, these methods entail a variety of problems, such as, for example, a small difference between "1" and "0", a process-related reliability problem for example in a method of reading a current difference such as a 1T type, and the like.

There is a problem in that the difference in the signal amount between "1" and "0" is small in a nondestructive readout method. For this reason, readout methods devised as follows have been proposed.

Japanese Laid-open Patent Application HEI 5-55664 describes a method in which a difference in differential permittivities is read out by applying a pulse below Vc. Japanese Laid-open Patent Application HEI 5-129622 describes a method in which the phase of a second harmonic component of a current response is detected by applying a bipolar pulse below Vc. Japanese Laid-open Patent Application HEI 6-275062 describes a method in which the phase of a second harmonic component of a current response is detected by applying a bipolar pulse below Vc.

Among the above-described art, in the method that uses a difference in differential permittivities for data readout (HEI 5-55664), the difference in differential permittivities is extremely small, such that it is extremely difficult to detect it by an ordinary readout method. Also, the difference may be readily cancelled by influences caused by continuous reading cycles, disturbs and the like.

The method in which the phase detection of a difference of harmonic components is performed (HEI 5-129622, HEI 6-275062) has a substantial problem in the readout sensitivity, because it is almost like picking up a minute signal from among noises.

Besides the above, there has been proposed a nondestructive readout method of reading a difference of currents when a minute bias is impressed.

However, the difference of currents upon impressing a minute bias is a difference that originates in the switching of the ferroelectric device, and there is a tendency that the difference is lost with the passage of time. The greater the difference between the initial "1" and "0," the more remarkable the tendency becomes, and a nondestructive readout is in effect impossible.

SUMMARY

The present invention pertains to a method for conducting a nondestructive readout of a ferroelectric memory device, and is characterized in that a response given when a pulse is applied to the ferroelectric memory device is resonated with a resonance frequency by a resonant circuit provided at a readout side, and outputted (FIG. 1).

The pulse applied may be one of a sine wave, a triangular wave and a square wave, in either a monopolar or a bipolar. Also, the amplitude of the pulse may preferably be a coercive voltage (Vc) or less of the ferroelectric film used in the capacitor, but may preferably be as small a voltage as possible within the range where a readout signal can be detected. For example, when a simple matrix structure is used for the device structure, because no selection transistor is provided, a part of the amplitude (voltage) of the impressed pulse is always impressed to a non-selected capacitor at the time of writing and also at the time of reading. In this case, the smaller the impressed voltage, the smaller an extra bit line capacity added from the non-selected capacitor, which is reflected on the operation speed.

The resonance method may be represented by an LC resonator, but a substitute method with transistors can also be used (FIG. 2).

When the capacitance of the ferroelectric memory device is C, and the resonance frequency is f, it is known that a relation $f=1/(2\pi\sqrt{(LC)})$ (L is inductance) is established. In other words, when C changes by $\Delta C$, the resonance frequency changes by $\Delta f$. The present invention is characterized in that, when the recorded information is read, a change in the resonance frequency is taken out nondestructively as recorded information. In other words, it is characterized in that the resonance frequency $f+\Delta f$ at an arbitrary time is converted into a response signal, and the data is retrieved. It is noted here that an FM demodulation method is usually used for conversion into a response signal, but other methods are also acceptable (FIG. 1).

The present invention is characterized in that, when data ("0" and "1") is stored in a ferroelectric capacitor, $\Delta f1$ is amplified in the same polarity as that of the applied voltage in a polarization P1 state, and $\Delta f2$ is amplified in a polarity opposite to that of the applied voltage, when opposite data is stored, in other words, in a polarization P2 state.

In accordance with the present invention, for example, there exists a so-called simple matrix type ferroelectric memory in which 1-bit data is store in each of memory elements. On the other hand, in order to increase effectiveness, it is preferred in the present invention that responses from two memory elements are mixed into one bit data, and the two memory elements are divided into an element for storage and an element for reference. The memory element for reference may be commonly shared, or may be provided for each bit. If the memory element for reference is shared, it is effective in increasing the memory capacity. If there is one memory element for reference for each bit, the burden of controlling the timing to impress a readout signal to each of the signal lines is reduced (FIG. 3).

BRIEF DESCRIPTION OF THE DRAWINGS

FIG. 11 shows diagrams of operation states of word lines and bit lines at the time of writing "1" in the ⅓V rule, in accordance with an embodiment.

FIG. 12 shows diagrams of application states of voltages applied to memory elements at the time of writing "0" in the ⅓V rule, in accordance with an embodiment.

FIG. 13 shows diagrams of application states of voltages applied to memory elements at the time of writing "1" in the ⅓V rule, in accordance with an embodiment.

FIG. 14 is a diagram of a block formed by stacking a plurality of layers of plane-shaped simple matrix structures having a structure in which 1-bit is stored in two capacitors disposed in series on a writing circuit, in accordance with an embodiment.

FIG. 20 shows diagrams of hysteresis curves of two capacitors that are laminated in series in a simple matrix type ferroelectric memory device in which capacitors for reference are stacked in layers in series on all capacitors for storage, in accordance with an embodiment.

FIGS. 28(a) through 28(c) shows diagrams of signal waveforms obtained when an attempt is made to directly take out a difference from a response signal according to a comparison method (28a: the relation between time and current value, 28b: a first differentiation of the current, 28c: a second differentiation of the current (second harmonic component)).

DETAILED DESCRIPTION

Figure 4:
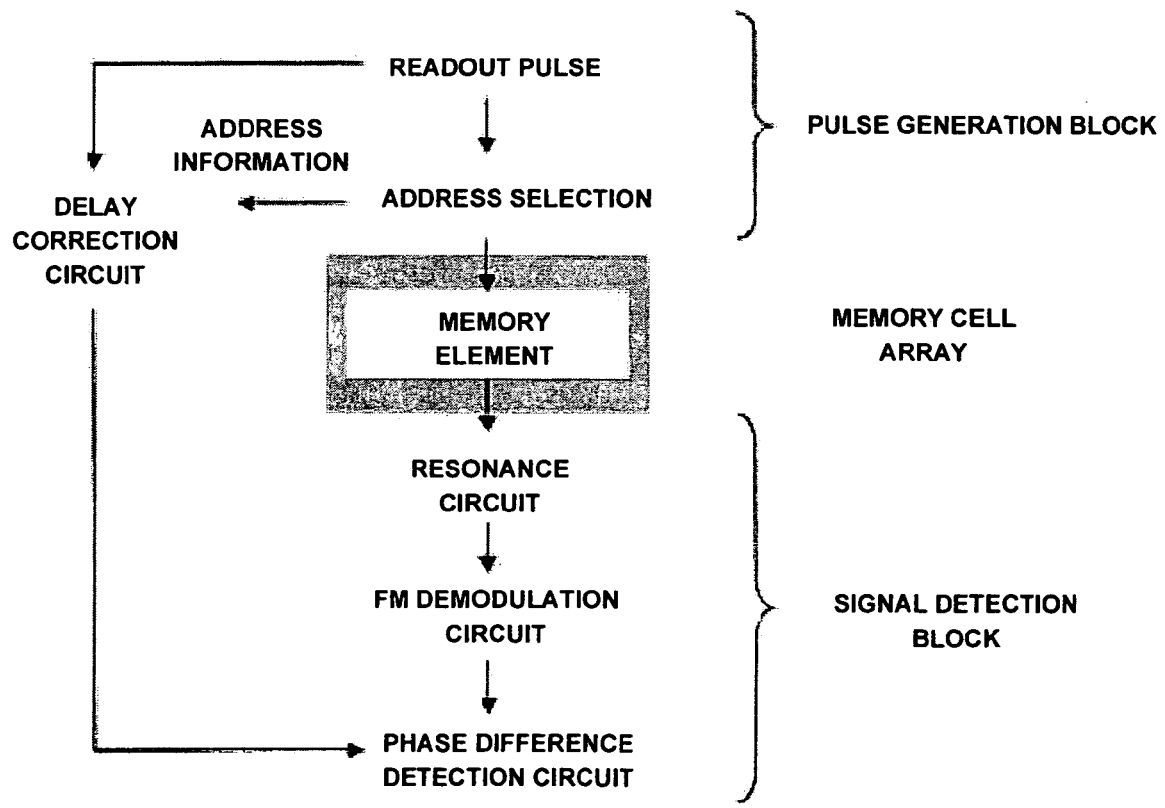
FIG. 4 is a diagram of an example of a sequence when one memory element is used for one-bit in accordance with an embodiment.

The nondestructive readout method in accordance with the present invention is further described. FIG. 4 shows an example in which one memory element is used as one bit. Because data to be read is the phase of a pulse generated by processing a response from the memory element, a pulse that becomes a reference to judge it is needed. For this reason, in the present embodiment, an output pulse for readout is drawn around separately to make a reference pulse. In this case, the reference pulse travels in a constant path, but a path in which the readout pulse travels to a memory element changes depending on the address of a selected memory element, and is not constant. For this reason, a control circuit that inputs data of the selected address somewhere in the path to correct the phase of the reference pulse or the response pulse is needed. Therefore, in this embodiment, a delay correction circuit is placed in the path of the reference pulse. However, other circuits with an equivalent function are also acceptable; for example, a method of controlling the timing at which the readout signal is applied to each of the signal lines is acceptable. As for phase difference detection, a phase difference between a response from a memory element and a reference pulse is detected, and when it is within a certain range, it is judged to be "1", and when it is not within the range, it is judged to be "0." In accordance with this judgment method, a judgment may be made from the amplitude of a pulse that is created by mixing a response from a memory element and a reference pulse, or another method is also acceptable.

Figure 5:
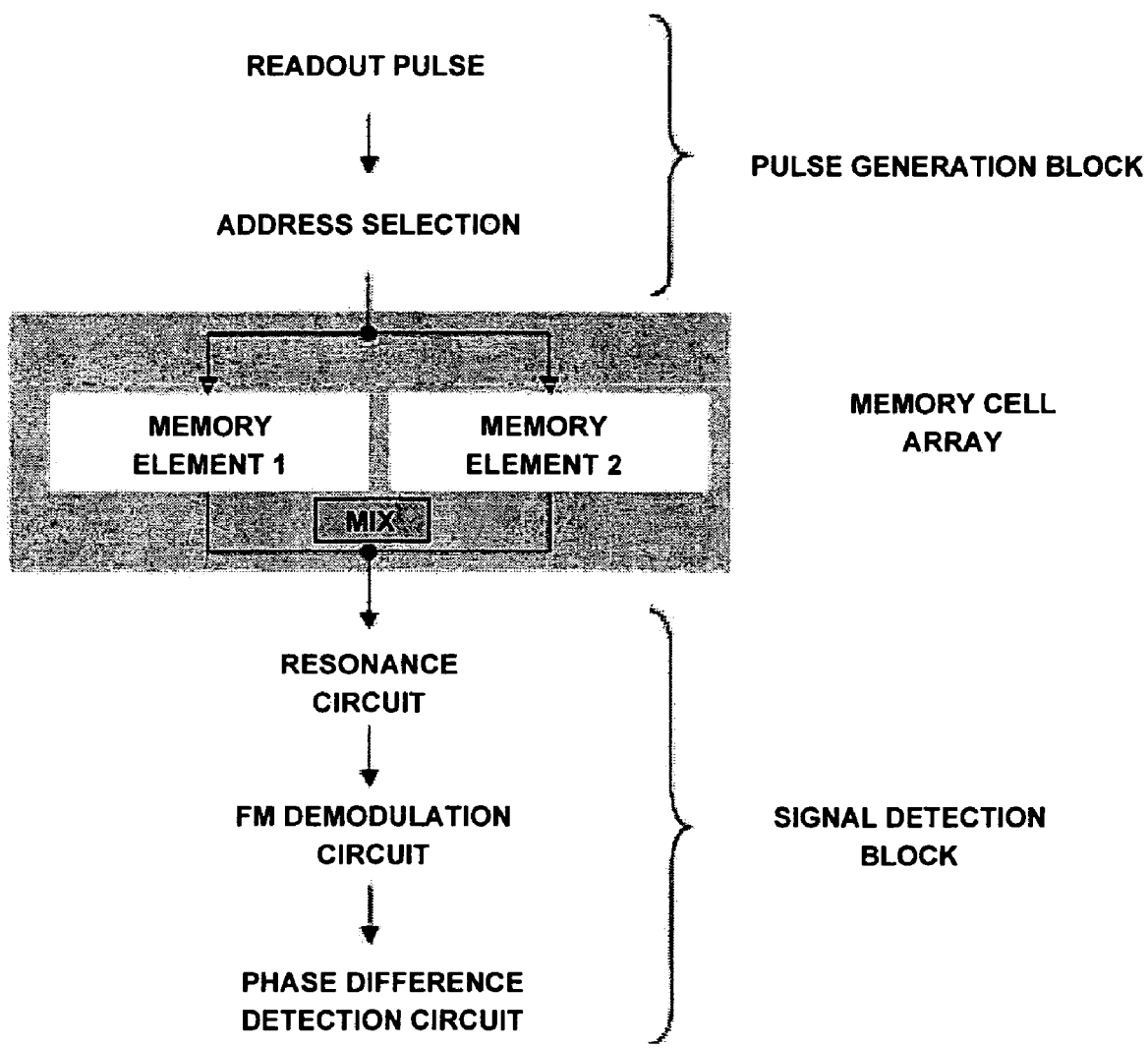
FIG. 5 is a diagram of an example (No. 1) of a sequence when two memory elements are used for one-bit in accordance with an embodiment.
Figure 6:
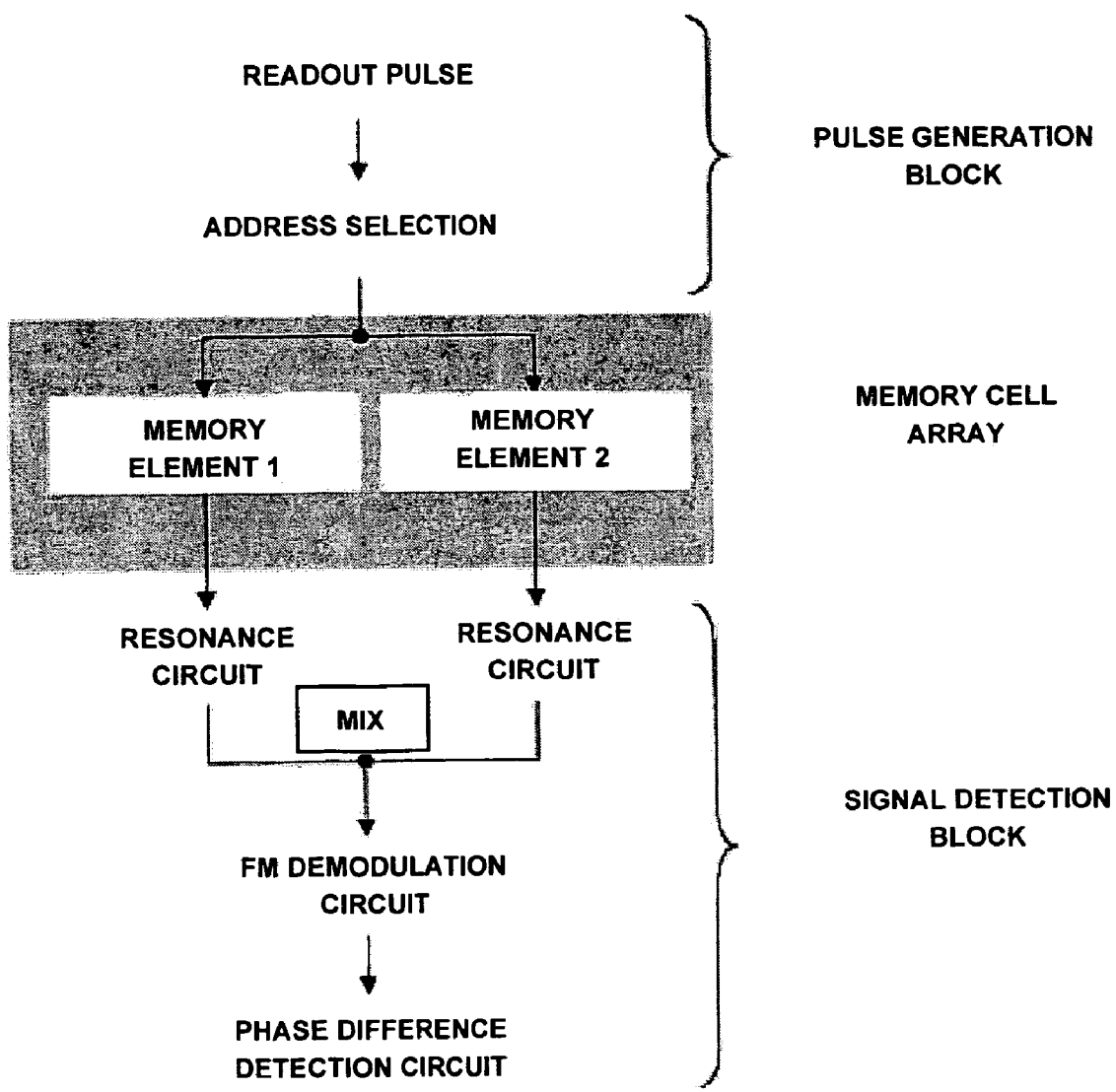
FIG. 6 is a diagram of an example (No. 2) of a sequence when two memory elements are used for one-bit in accordance with an embodiment.
Figure 7:
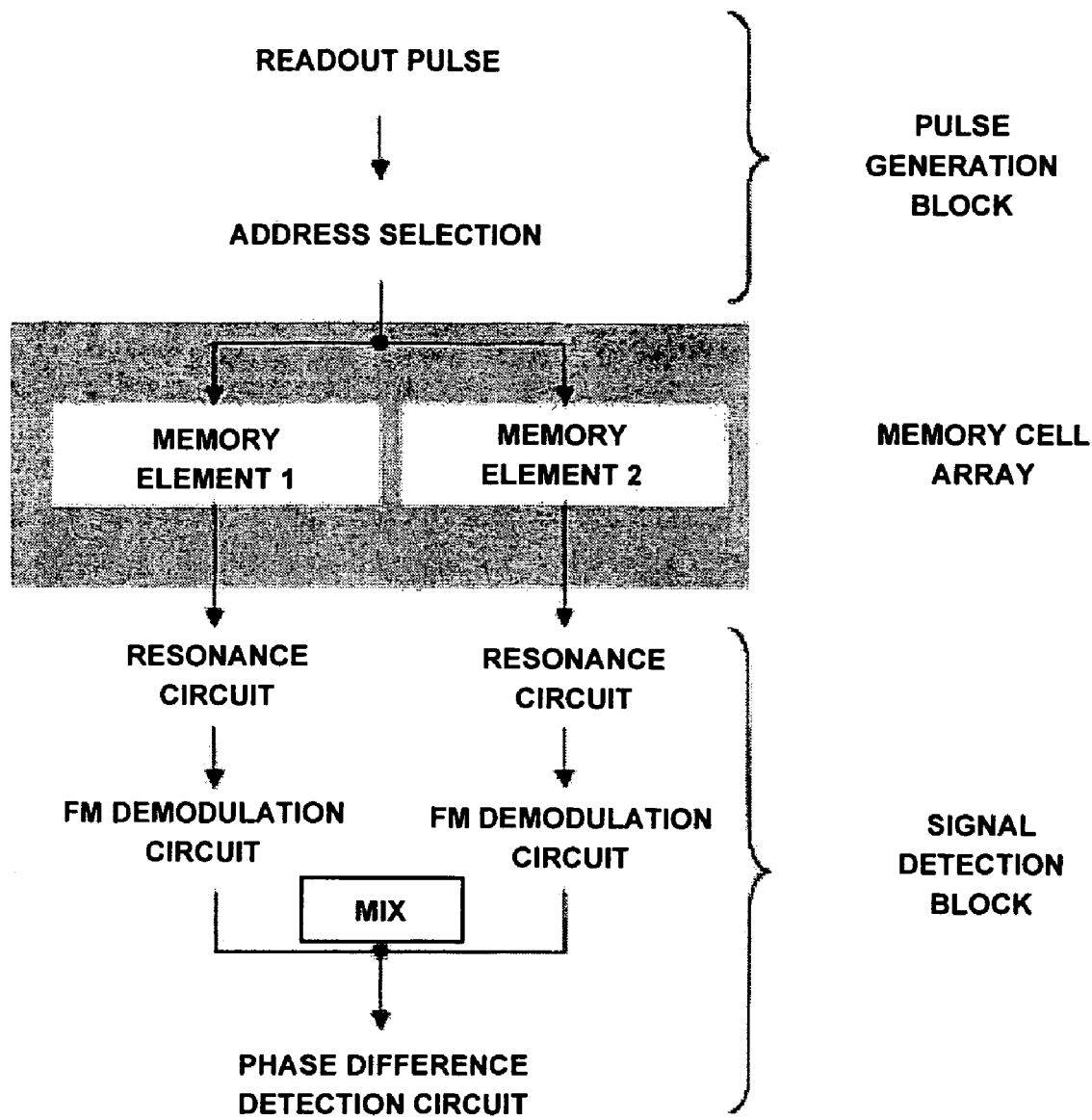
FIG. 7 is a diagram of an example (No. 3) of a sequence when two memory elements are used for one-bit in accordance with an embodiment.
Figure 8:
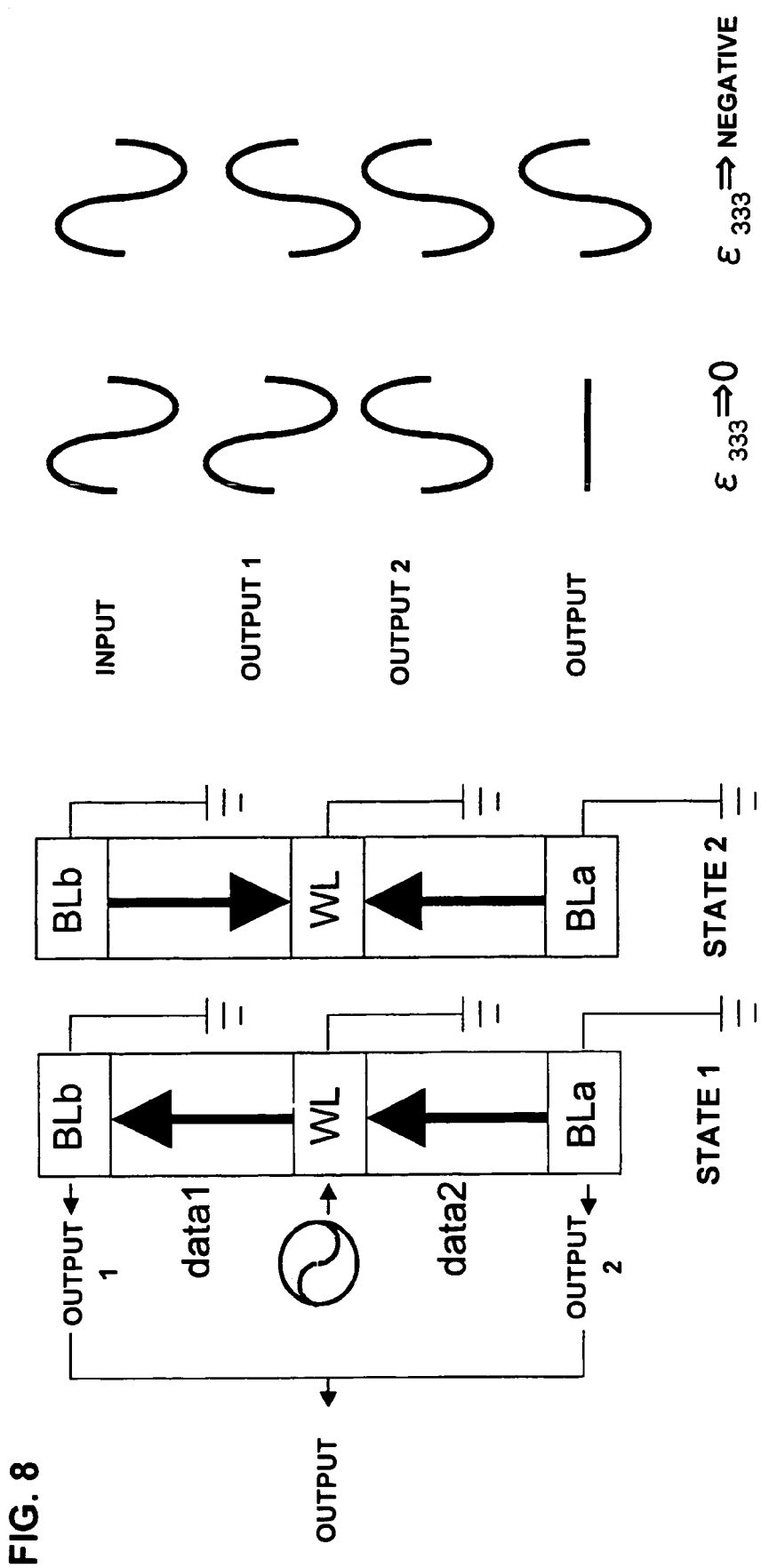
FIG. 8 shows diagrams showing polarization states and I/O signals when two memory elements are used for one-bit in accordance with an embodiment.

FIGS. 5-7 show examples in which two memory elements are used as one bit. In either of the cases, a readout pulse is given to two memory elements, and responses from them are mixed to form one bit data. The two memory elements are divided into an element for storage and an element for reference. The element for reference may be commonly shared or provided for each bit. When it is shared, it is effective in increasing the memory capacity, but needs a device for phase correction, like the example shown in FIG. 4. However, unlike the example in FIG. 4, elements for reference can be mixed at an arbitrary ratio, such that the device for phase correction may be more simplified compared to the example in FIG. 4, or the device for phase correction may be omitted depending on the relation between the element for reference and the detection margin (FIG. 8). On the other hand, if an element for reference is provided for each bit, the relation between the element for storage and the element for reference can be kept unchanged for each of the bits, and therefore the device for phase correction can be omitted. Responses from two memory elements can be mixed at any one of the following timings: (1) before they are resonated; (2) when outputted after they are resonated; (3) after they are further converted to response signals. Sharing of a readout circuit can be readily made in the order of (1), (2) and (3), but the readout reliability is higher in the order of (3), (2) and (1).

Figure 9:
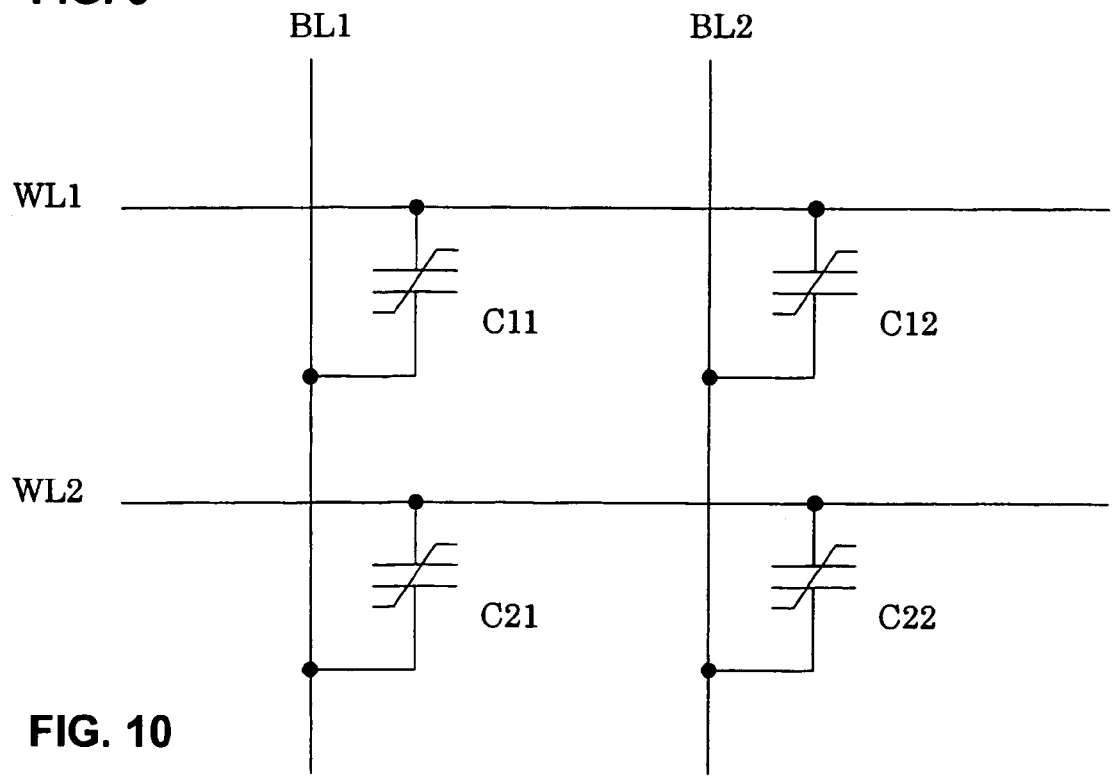
FIG. 9 is an equivalent circuit diagram of a simple matrix type ferroelectric memory device characterized in that a data writing operation is performed by using the ⅓V rule or the ½V rule, in accordance with an embodiment.
Figure 10:
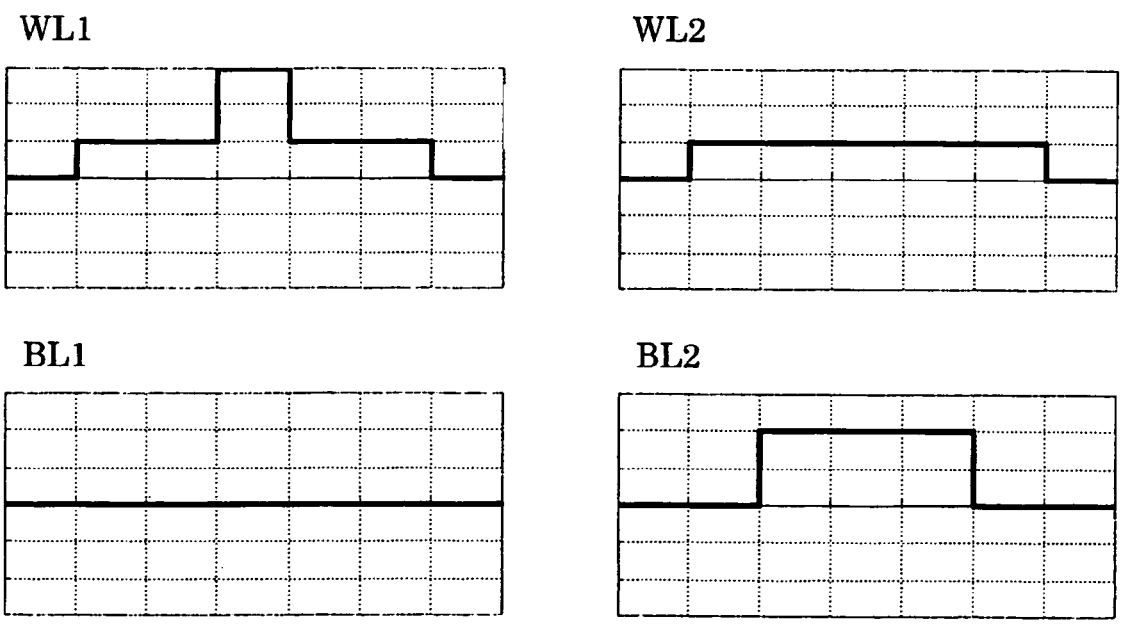
FIG. 10 shows diagrams of operations states of word lines and bit lines at the time of writing "0" in the ⅓V rule, in accordance with an embodiment.

A typical method for data writing operation may be used in each memory type. For example, a simple matrix type ferroelectric memory is described as one mode of a ferroelectric memory in accordance with the present invention. FIG. 9 shows a circuit of the simple matrix type ferroelectric memory, wherein each memory element is formed by each capacitor that is disposed at a position where a word line and a bit line intersect each other. Data writing can be performed according to an ordinary method. An example of data writing according to the ⅓ V rule in which a voltage that is impressed to a non-selected memory element is one third (⅓) of a voltage that is impressed to a selected memory element is described, as one of the exemplary methods. When "0" or "1" is written in a selected memory element, a voltage is applied to the word line and the bit line by the sequence shown in FIG. 10 or FIG. 11. The purpose of shifting the timing at which the voltage applied to each of the lines is changed is to prevent a voltage that is ⅓ or greater of the operation voltage from being applied to a non-selected memory cell. These operations are desirably performed according to the figures, but are not limited to the illustrated examples as long as similar operations can be performed. Voltages that are to be applied to a selected memory element and a non-selection memory element when the voltages are applied according to the sequence shown in FIG. 10 or FIG. 11 are shown in FIG. 12 or FIG. 13, respectively. A writing of "0" or "1" is performed at the fourth sequence in each of the memory elements. On the other hand, at the time of a readout operation, a prescribed pulse is applied only to a selected word line WL1, and no voltage is applied to other word lines or the bit lines at all. At this time, the voltage and frequency of a pulse applied to the selected word line WL1 may preferably be a voltage and frequency which do not cause an inversion of data in the non-selected memory elements. The voltage may preferably be a substantially low voltage, more preferably be one third (⅓) of the writing voltage, and the frequency may preferably be a high frequency that does not cause an inversion of data even when the voltage is somewhat high.

Figure 15:
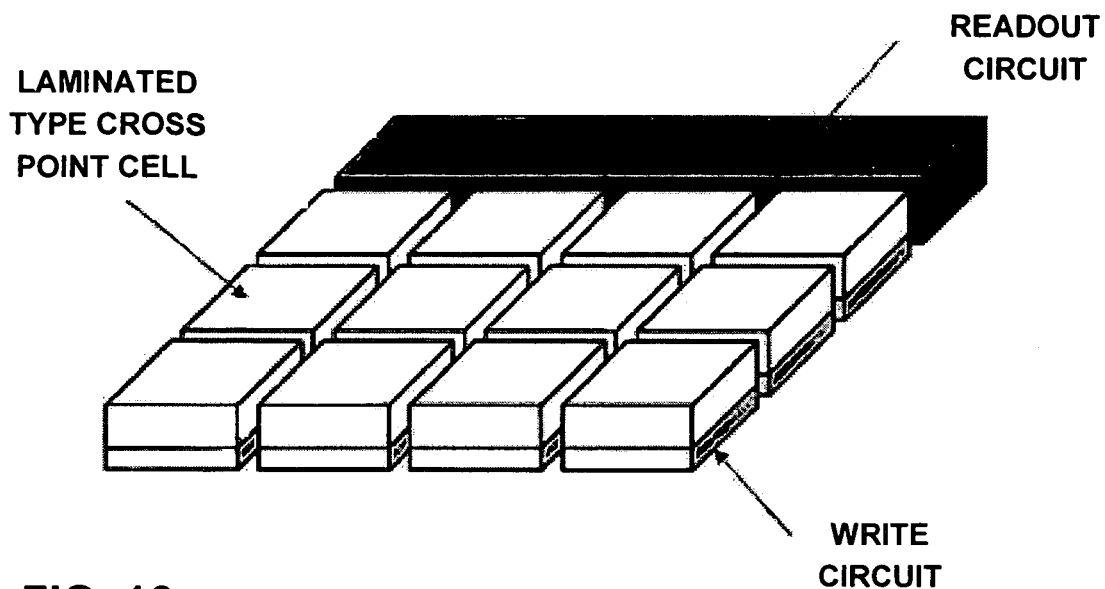
FIG. 15 is a diagram of a nondestructive readout type ferroelectric memory device of the present invention having a combination of an integration of a plurality of blocks each formed by stacking a plurality of layers of plane-shaped simple matrix structures having a structure in which 1-bit is stored in two capacitors disposed in series on a writing circuit as a one-unit cell, and a circuit that reads out the entire blocks at once.

To use the present invention is just to achieve a large capacity memory. By using the above-described (a)-(h), a memory array shown in FIG. 14 can be achieved. In this case, the memory array has a structure in which 1-bit is stored in each two capacitors arranged in series, which are made one unit cell, and is formed in a simple matrix structure in a plane shape. Furthermore, FIG. 14 shows a plurality of simple matrix structures laminated in layers. Only a circuit that performs data writing to all of the cells is formed on a Si wafer, and each writing circuit is disposed at a lower surface of each and every capacitor cell, which is made a block. A plurality of blocks are combined, and a circuit that reads the entire blocks simultaneously or with time lags in a nondestructive manner is combined with the blocks, whereby a large capacity is realized as shown in FIG. 15.

A capacitor structure in accordance with an embodiment of the present invention is described.

Figure 1:
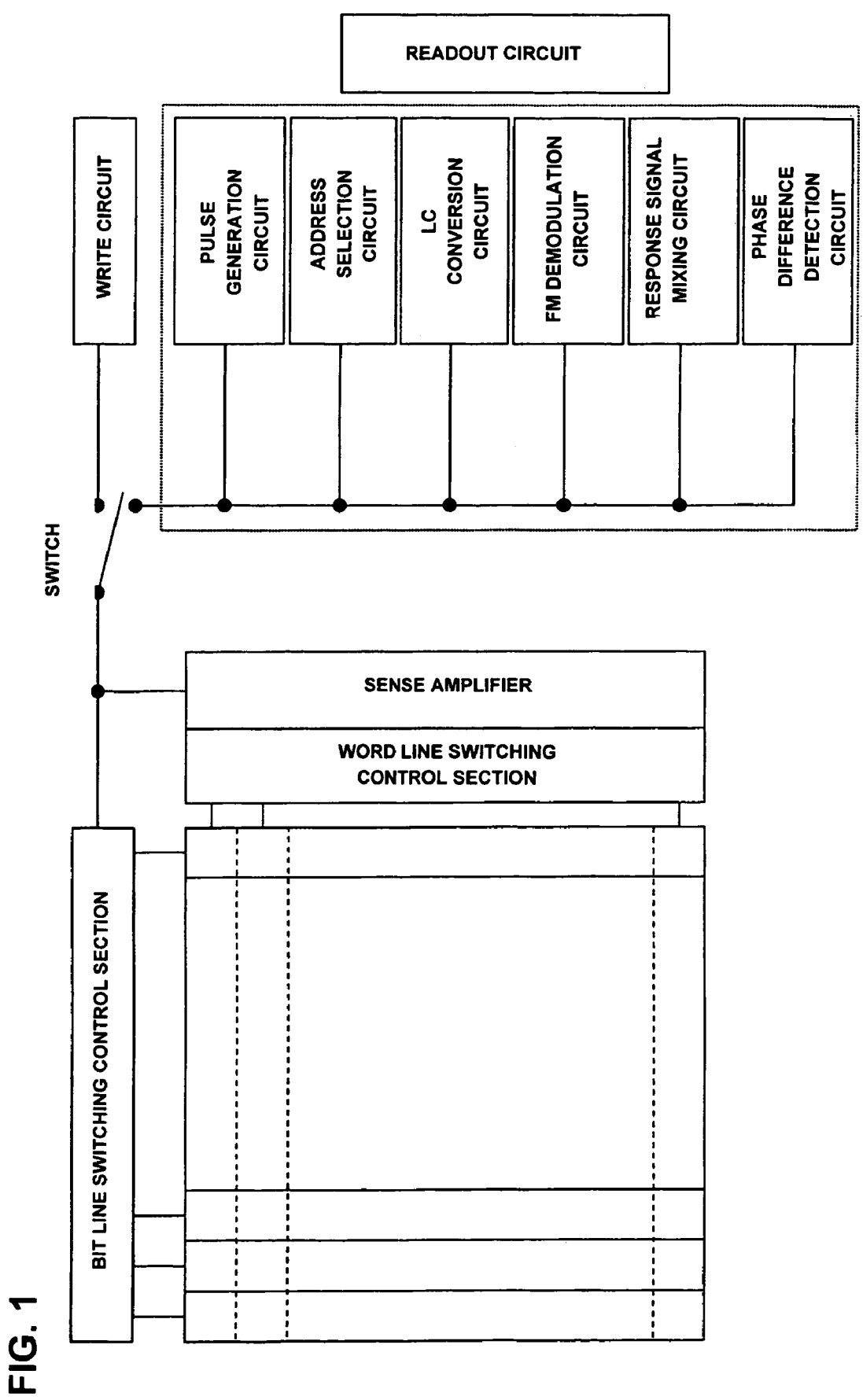
FIG. 1 is a diagram of a ferroelectric memory device in accordance with an embodiment characterized in that a response given when a pulse is applied is resonated with a resonance frequency by a resonant circuit provided at a readout side, and outputted.
Figure 2:
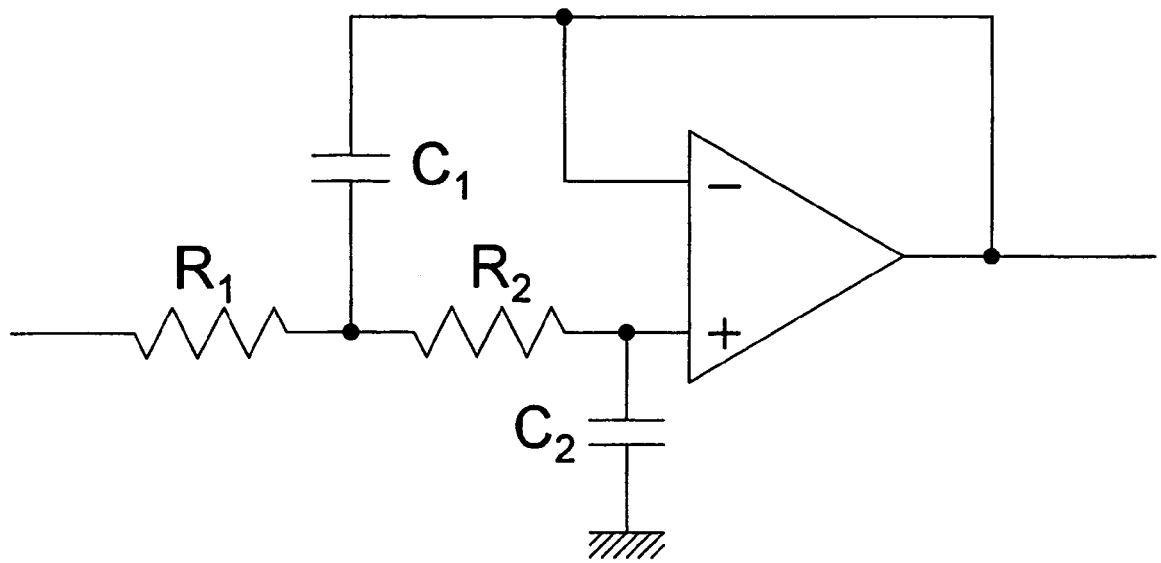
FIG. 2 is a diagram showing a substitute circuit of an LC resonator with transistors in accordance with an embodiment.
Figure 3:
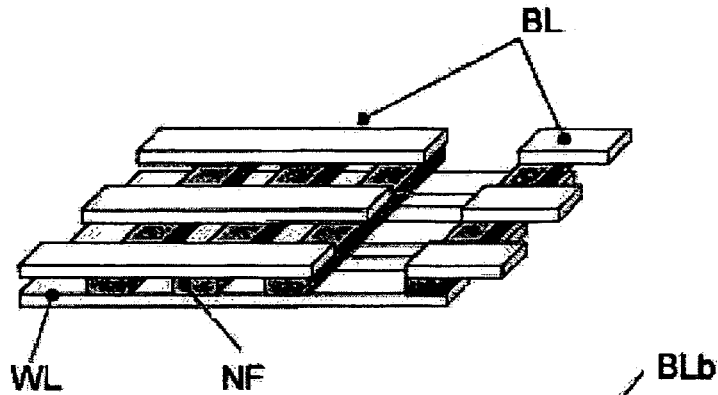
FIGS. 3 (a) through 3(b) is a diagram of a ferroelectric memory device in accordance with an embodiment characterized in that responses from two memory elements are mixed to provide one-bit information, and the two memory elements are divided in an element for storage and an element for reference.
Figure 3:
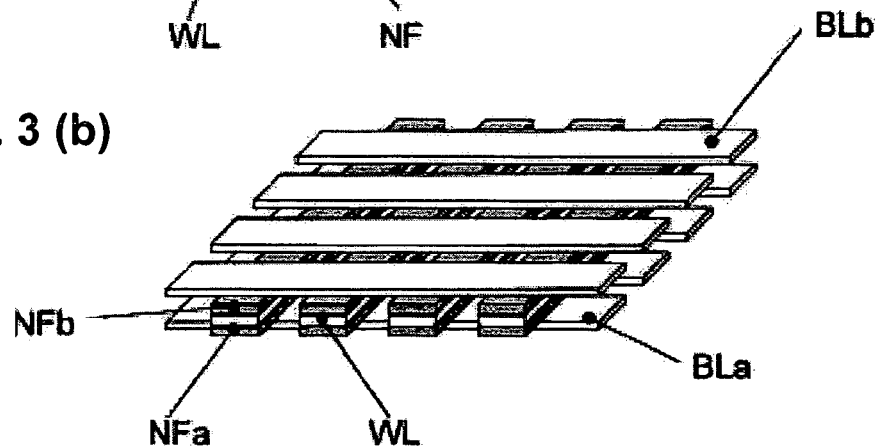

A simple matrix type ferroelectric memory device, which is composed of: 1. word lines (WL), 2. bit lines (BL), 3. first ferroelectric layers for data writing (Ca), and 4. second ferroelectric layers for data reference (Cb), was manufactured. FIG. 3a is a structural diagram of the device in this case.

For the ferroelectric raw material, a Pb(Zr,Ti,Nb)O$_3$ thin film was used. Nb and Si were added in a sol-gel solution for forming PZT beforehand, and by using a spin coat method, a PZTN (110/20/60/20) thin film having a film thickness of 150 nm was formed under an oxygen atmosphere at 650° C.

Figure 16:
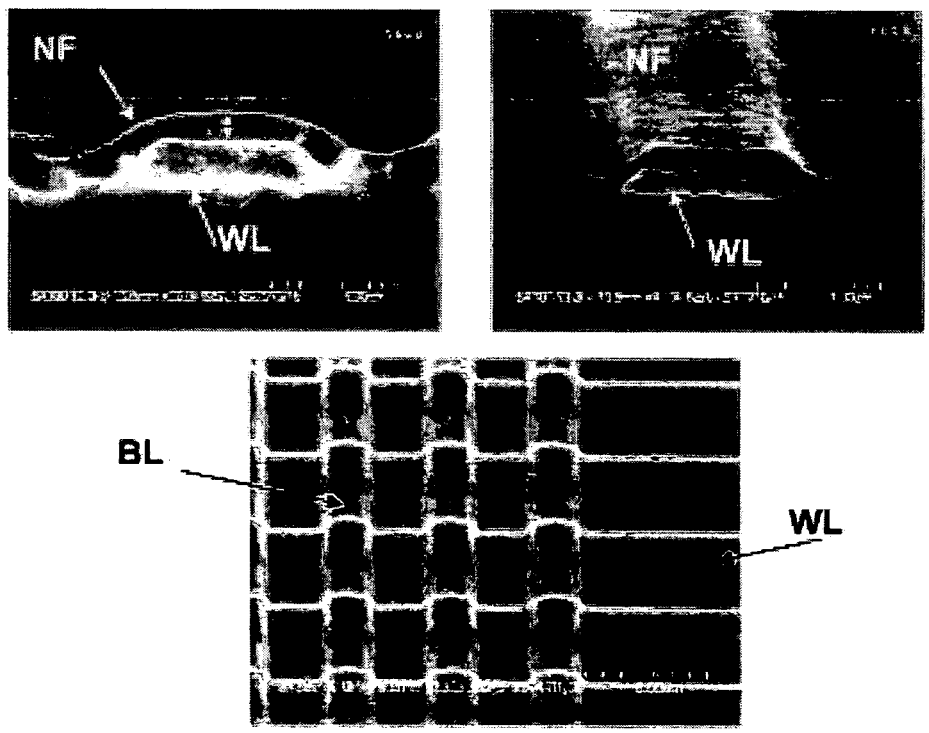
FIG. 16 is a cross-sectional view of a ferroelectric memory device characterized in that one ferroelectric capacitor for reference is provided for each bit line, in accordance with an embodiment.
Figure 17:
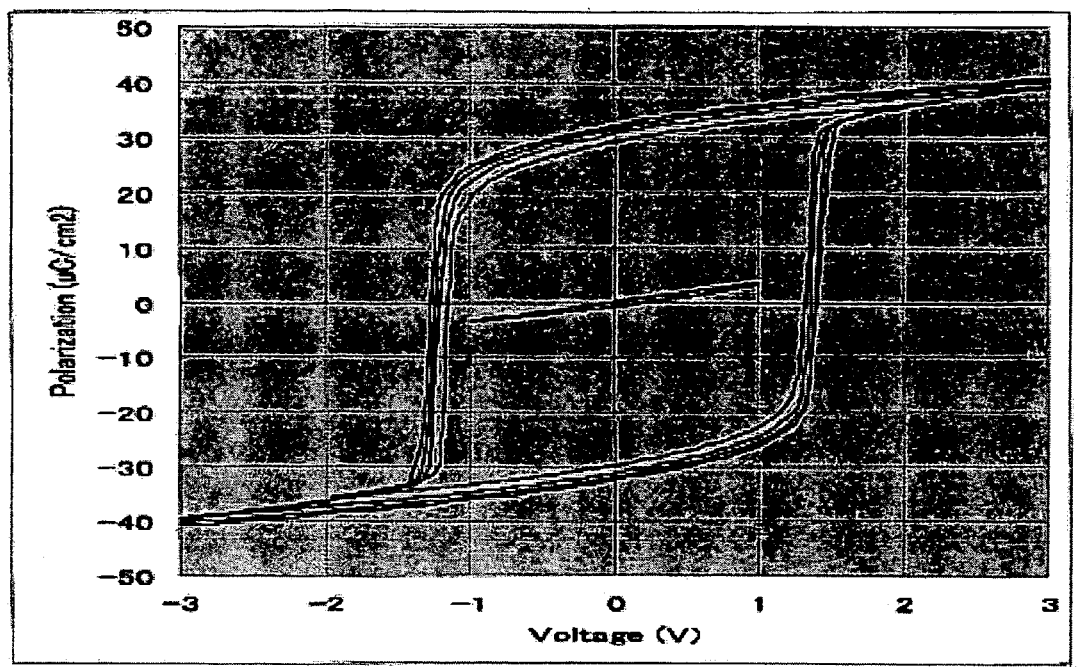
FIG. 17 is a hysteresis curve of a 0.6 μm×0.6 μm PZTN capacitor in accordance with an embodiment.

A cross section of the device actually made for trial purposes is shown in FIG. 16. This device was formed with the 0.6 μm rule, and each of the entire capacitors consists of a minute capacitor having an area of 0.6 μm×0.6 μm. A typical hysteresis characteristic is shown in FIG. 17 in this case.

Figure 18:
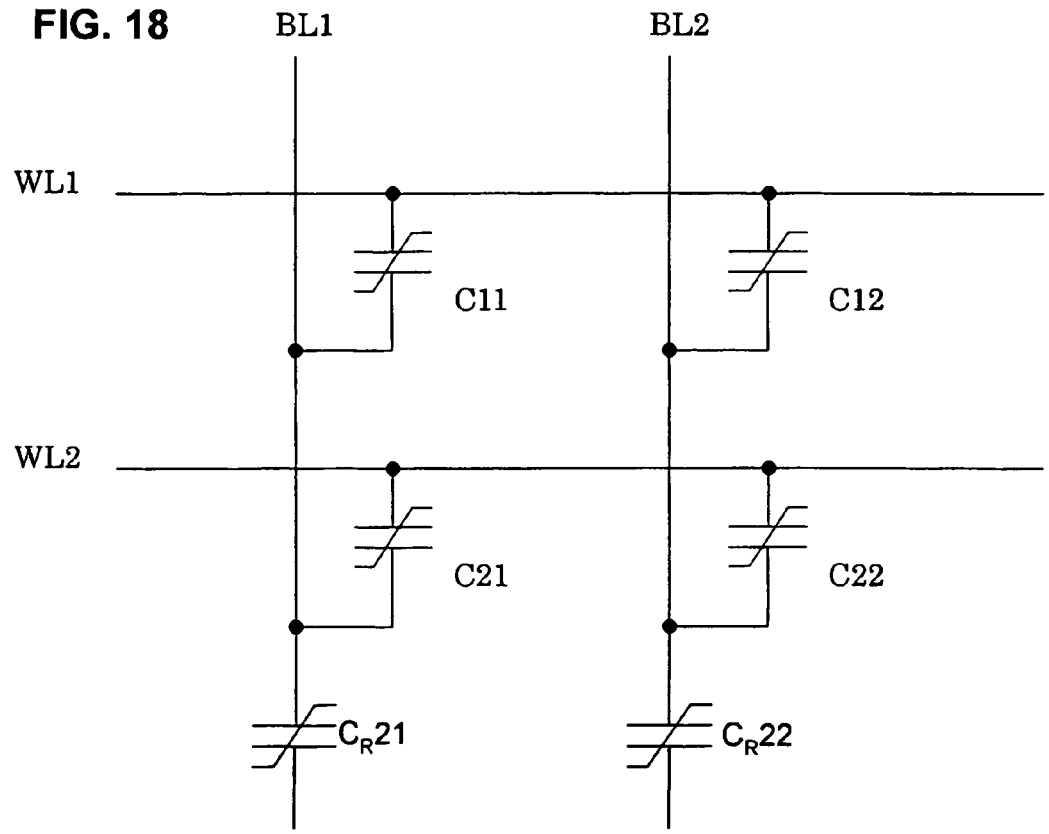
FIG. 18 is an equivalent circuit diagram of a memory device having one ferroelectric capacitor for reference provided for each bit line, in accordance with an embodiment.

Also, FIG. 18 shows an equivalent circuit diagram of the device made for trial purposes.

Next, cells for reference are stacked in layers in series on the entire capacitors for storage, whereby a simple matrix type ferroelectric memory device was made for trial purposes, which suppresses the non-selected capacitance to the minimum.

A simple matrix type ferroelectric memory device, which is composed of: 1. word lines (WL), 5. first bit lines (BLa), 6. second bit lines (BLb), 3. first ferroelectric layers (Ca), and 4. second ferroelectric layers (Cb), was manufactured. FIG. 3b is a structural diagram of the device in this case.

Figure 19:
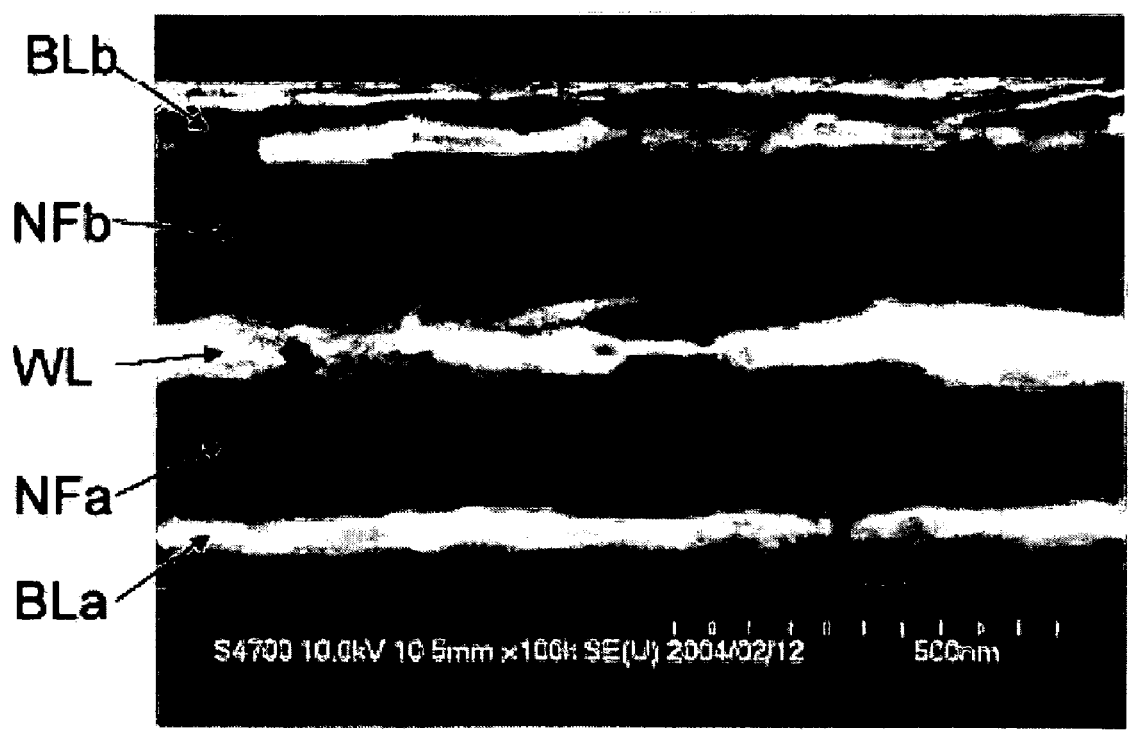
FIG. 19 is a SEM image of a cross section of two capacitors that are laminated in series in a simple matrix type ferroelectric memory device in which capacitors for reference are stacked in layers in series on all capacitors for storage, in accordance with an embodiment.

FIG. 19 shows an enlarged photograph of two capacitors (cell for storage+cell for reference) that are arranged in series. Moreover, in this case, the cell for storage and the cell for reference exhibited almost identical characteristics as shown in FIG. 20, which were excellent characteristics.

Figure 21:
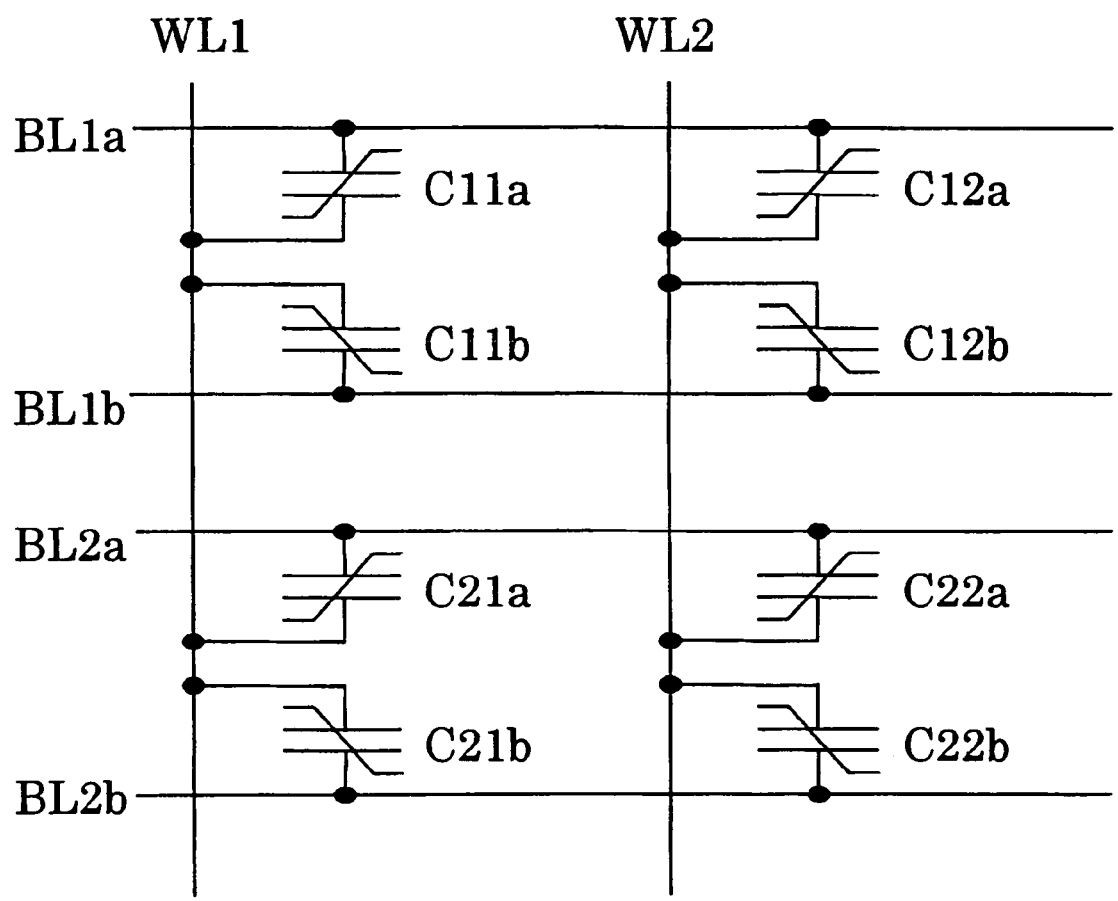
FIG. 21 shows an equivalent circuit diagram of a simple matrix type ferroelectric memory device in which capacitors for reference are stacked in layers in series on all capacitors for storage, in accordance with an embodiment.

Moreover, FIG. 21 shows an equivalent circuit diagram of the device made for trial purposes. The advantage in using the structure in which the capacitors for reference are disposed in series to the entire capacitors for writing through the same word line in accordance with the present embodiment is that the power supply noise impressed to the same word line is completely canceled in addition to the nonselected capacity being suppressed to a small level.

Figure 22:
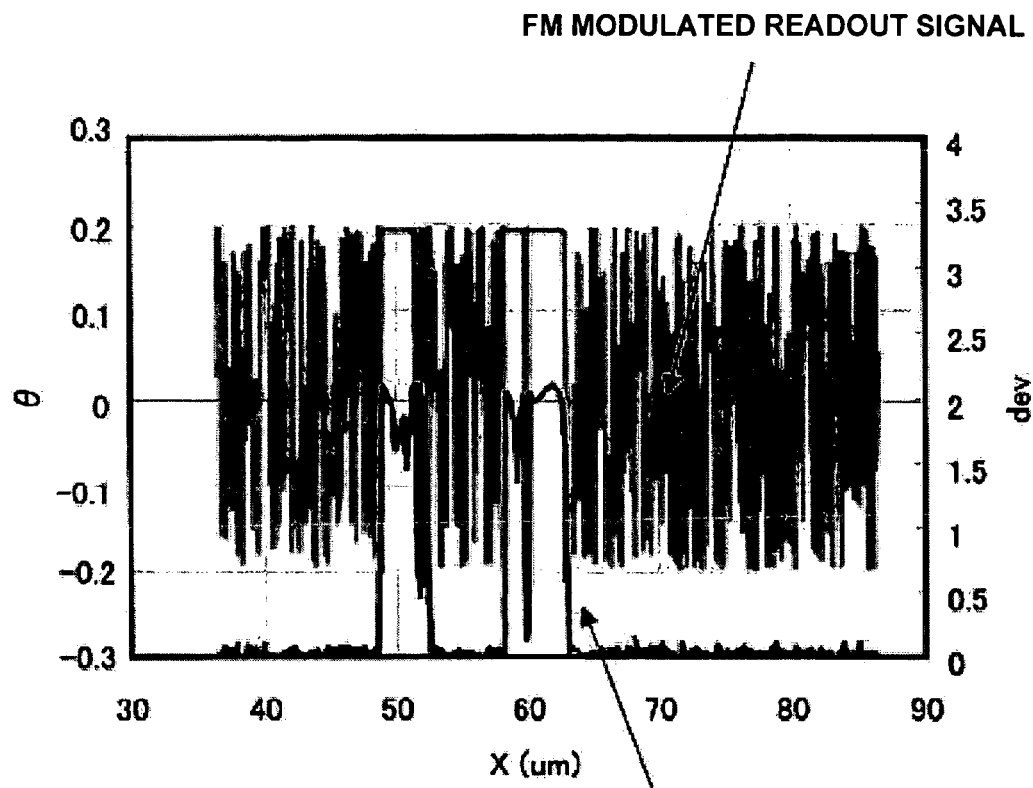
FIG. 22 shows readout signals that are given by applying a pulse having an amplitude of 0.2V to a unit cell that is formed by stacking capacitors for reference in layers in series on all capacitors for storage, and FM modulated, and readout signals that are further FM modulated, in accordance with an embodiment.

Data was written in the ferroelectric memory device made for trial purposes in the manner described above, and the written signals could be read out with a pulse having an amplitude of 0.1 V, as shown in FIG. 22.

Figure 23:
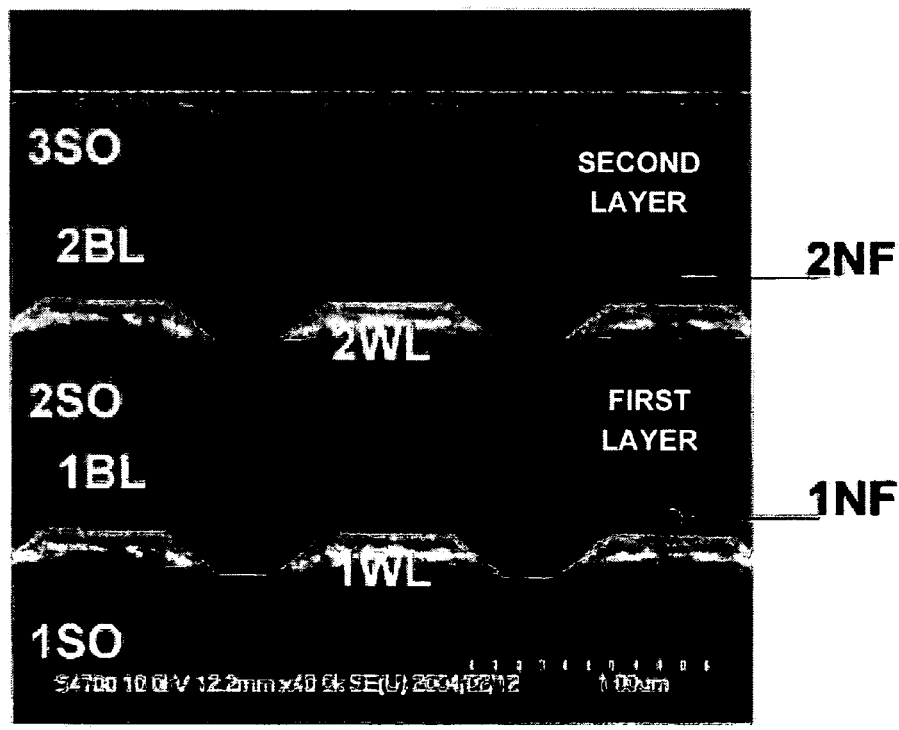
FIG. 23 is a SEM image of a cross section of a laminated type memory device in accordance with an embodiment having a 500-kbit capacity in accordance with an embodiment of the present invention formed by stacking simple matrix type memory arrays each having a 250-kbit capacity in two layers in which capacitors for reference are laminated in series on all of the capacitors for storage.

Moreover, a device of 500 kbit capacity in which the memory devices were stacked in two layers was manufactured for trial purposes by using the present invention, and FIG. 23 shows a cross-sectional view thereof. This memory device exhibited excellent memory characteristic.

The reading method used by the present invention was examined in greater detail based on the following embodiment examples.

Pulses in the shape of a sine wave, a square wave, a triangular wave, or the like are applied to the ferroelectric memory device (concretely, ferroelectric capacitors).

Figure 24:
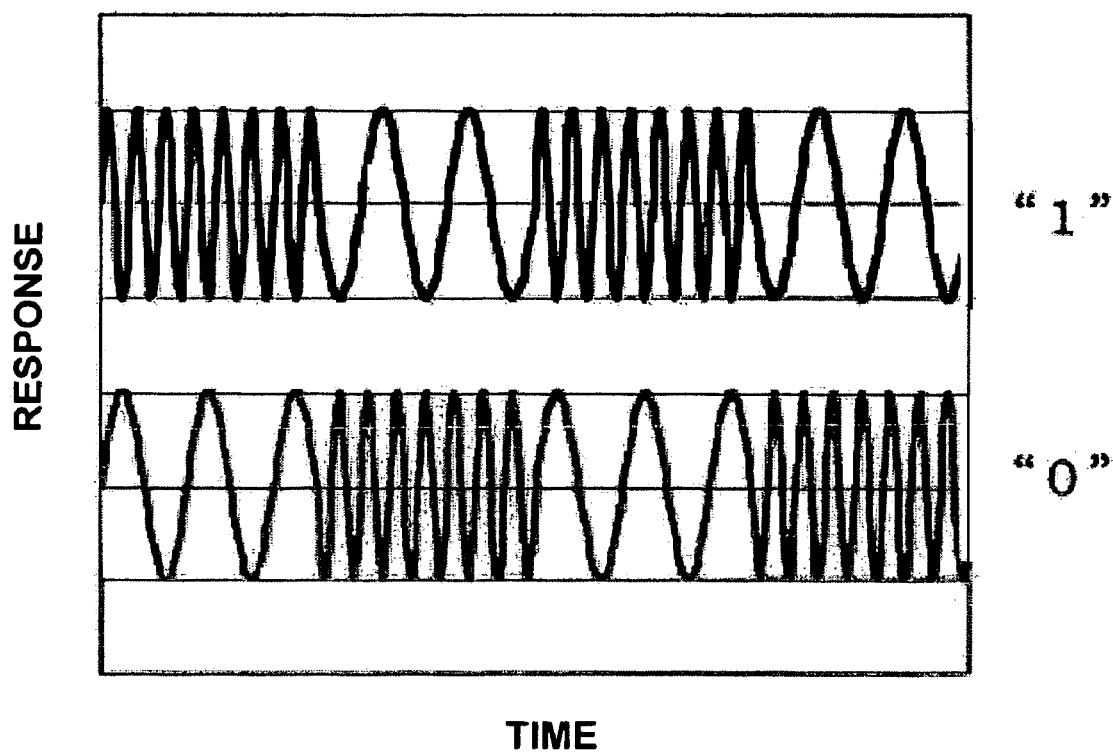
FIG. 24 is a diagram of waveforms of resonant frequencies modulated according to changes of the capacity of a ferroelectric capacitor that changes according to a voltage of a readout pulse, in accordance with an embodiment.

Responses in this instance are read out, and they are resonated by an LC resonance circuit. At this time, the capacity of the ferroelectric capacitor-changes according to the voltage of the pulse, and the resonance frequency changes at the same time according to the change of the capacity. The modulated waveform at this time is shown in FIG. 24.

Figure 25:
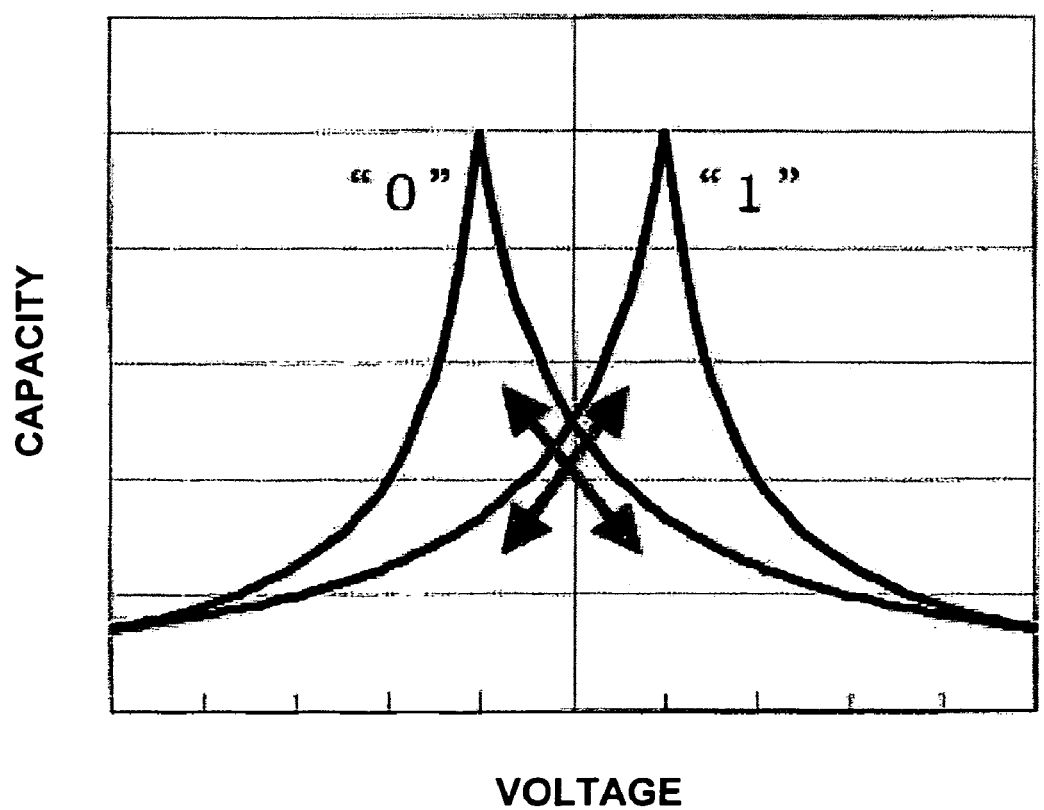
FIG. 25 shows the relation between polarization directions of ferroelectric and changes of its capacity, in accordance with an embodiment.

It is noted here that FIG. 25 shows the relation between the polarization direction of the ferroelectric and the change of capacity, and it is generally known that the direction of the capacity change is reversed by the state of storage. Therefore, because the direction of the change in capacity is naturally reflected in the direction of the change in resonance frequency, the direction of the change in resonance frequency is also reversed by the state of storage (polarization).

Figure 26:
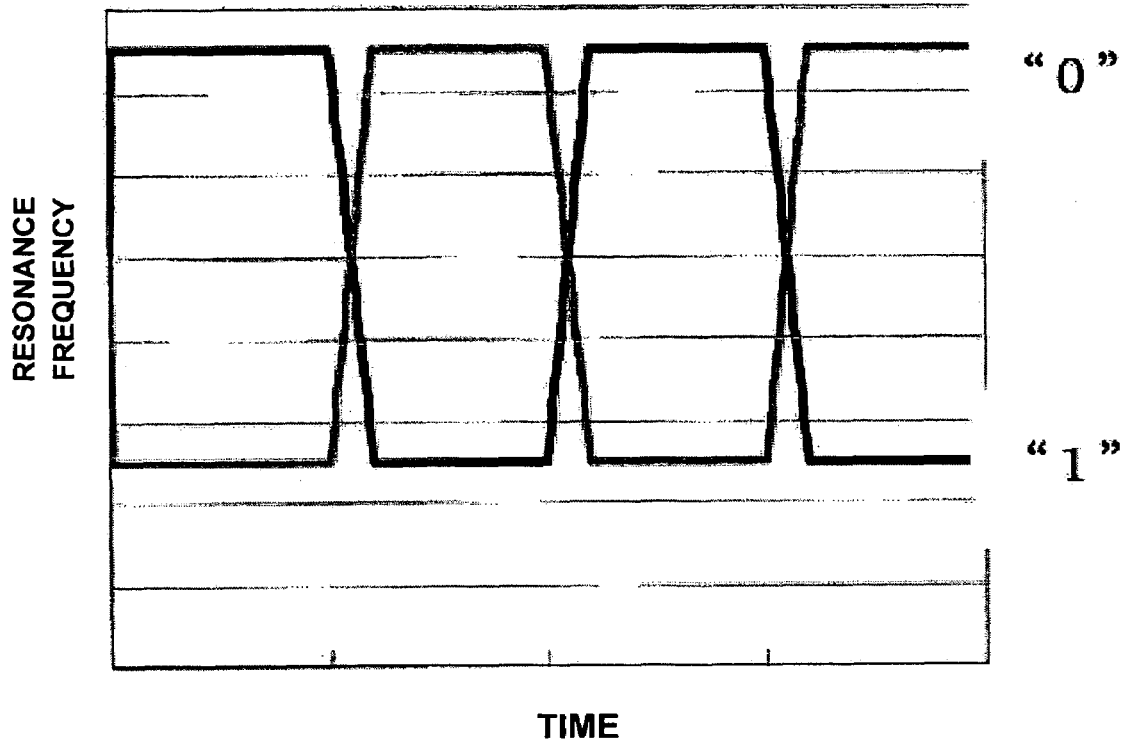
FIG. 26 is a diagram indicating that, the capacity of a ferroelectric capacitor changes according to a voltage of a readout pulse, a waveform of a resonance frequency modulated according to the capacity change is FM demodulated, and the waveform of a readout signal is inverted depending on the data storage state (polarization direction) at this moment.

Therefore, when a resonance frequency is converted into a response signal such as a voltage or the like, the response signal whose phase is reversed by "1" or "0" is obtained as shown in FIG. 26.

In effect, the capacity change is small, and a change of only about $10^{-4}$-$10^{-7}$ times the original resonance frequency occurs. In addition, because this change is in proportion to the voltage, and only a low voltage can be applied in view of the characteristic of a nondestructive readout, the change in frequency becomes much smaller.

The above-described states are defined by the following formula (1).

$$\frac{\Delta Cf}{Cf_0} = \frac{\varepsilon(3)}{\varepsilon(2)} Ep \cos(\omega pt) \quad (1)$$

i. $+\frac{\varepsilon(4)}{\varepsilon(2)} Ep^2 \cos(2\omega pt)$

Figure 27:
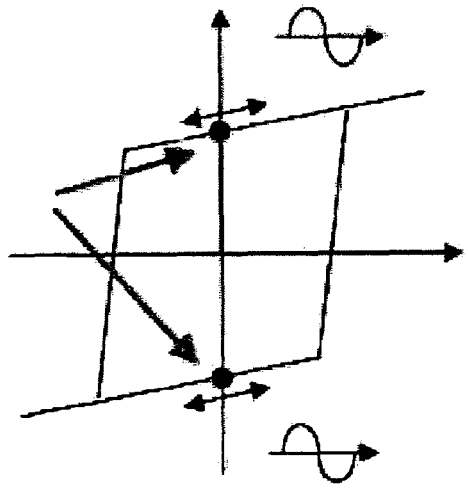
FIG. 27 shows a diagram showing a sequence of directly taking out a difference from a response signal according to a comparison method.

-continued ii. $+\frac{\varepsilon(5)}{\varepsilon(2)} Ep^3 \cos(3\omega pt) + \ldots$ It is possible to take out this change because of the frequency detection. As an example of comparison, a voltage of +3V or -3V was impressed to the ferroelectric capacitor to precharge the same in "0" or "1" to thereby write data, and then a sine wave of minute amplitude (0.2V) was impressed, and an attempt was made to directly take out a difference from a response signal (minor loop) in that case (FIG. 27). A variety of examinations was conducted, and the results shown in FIG. 28 were obtained. FIG. 28a indicates the relation between time and the current value, FIG. 28b indicates a first differentiation of the current, and FIG. 28c additionally indicates a second differentiation of the current.

As a result, it was found that there was almost no difference with respect to the main signal between "1" and "0." It was found that, even if there was some difference due to the direction of polarization, desired information was buried in the noise, and was deleted.

Figure 29:
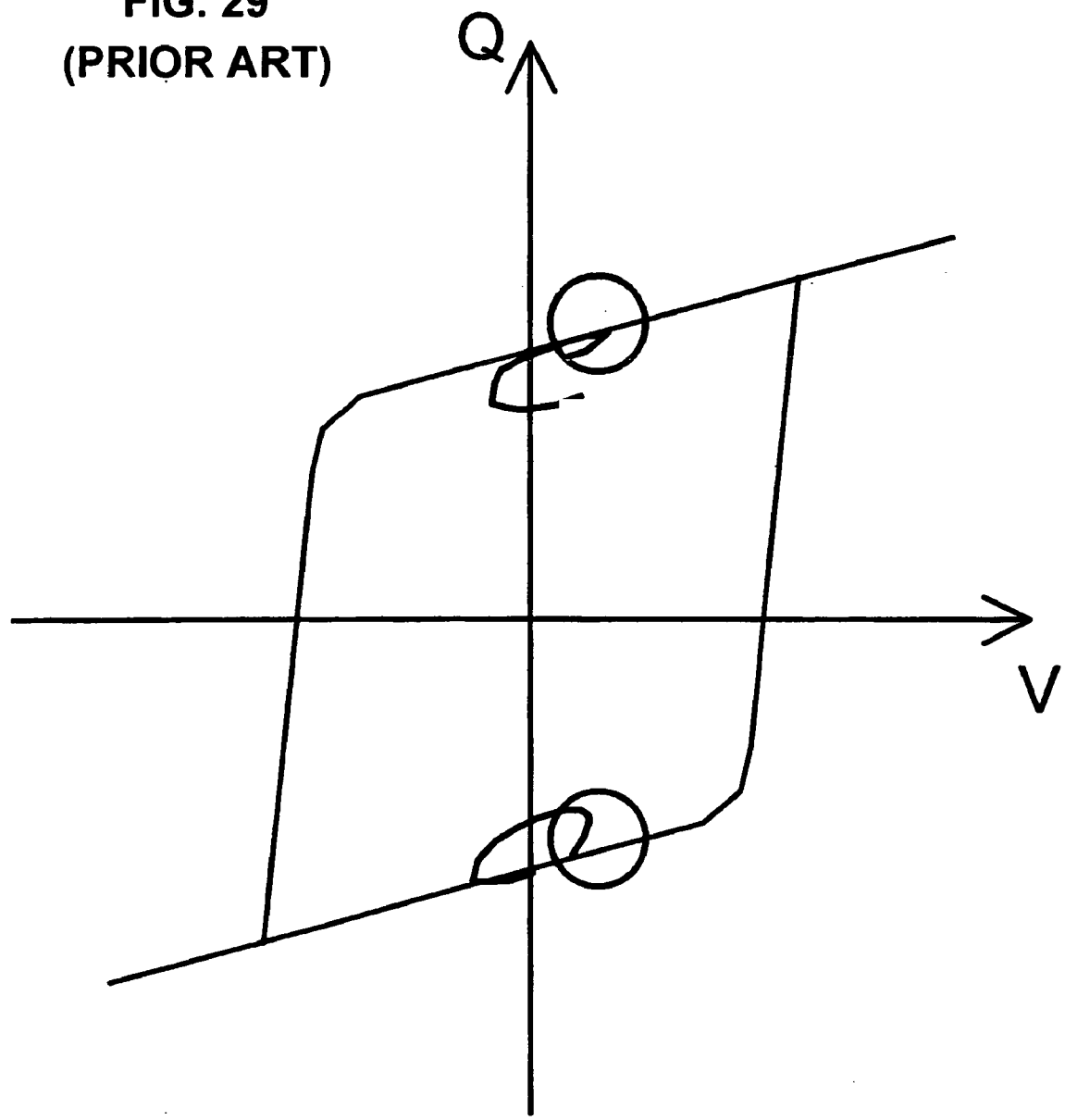
FIG. 29 is a diagram showing that, when an attempt is made to directly take out a difference from a response signal by a comparison method, and a minute voltage is applied to a ferroelectric thin film, differences in the polarization state appear in the shape of a minor loop only in the first cycle.
Figure 30:
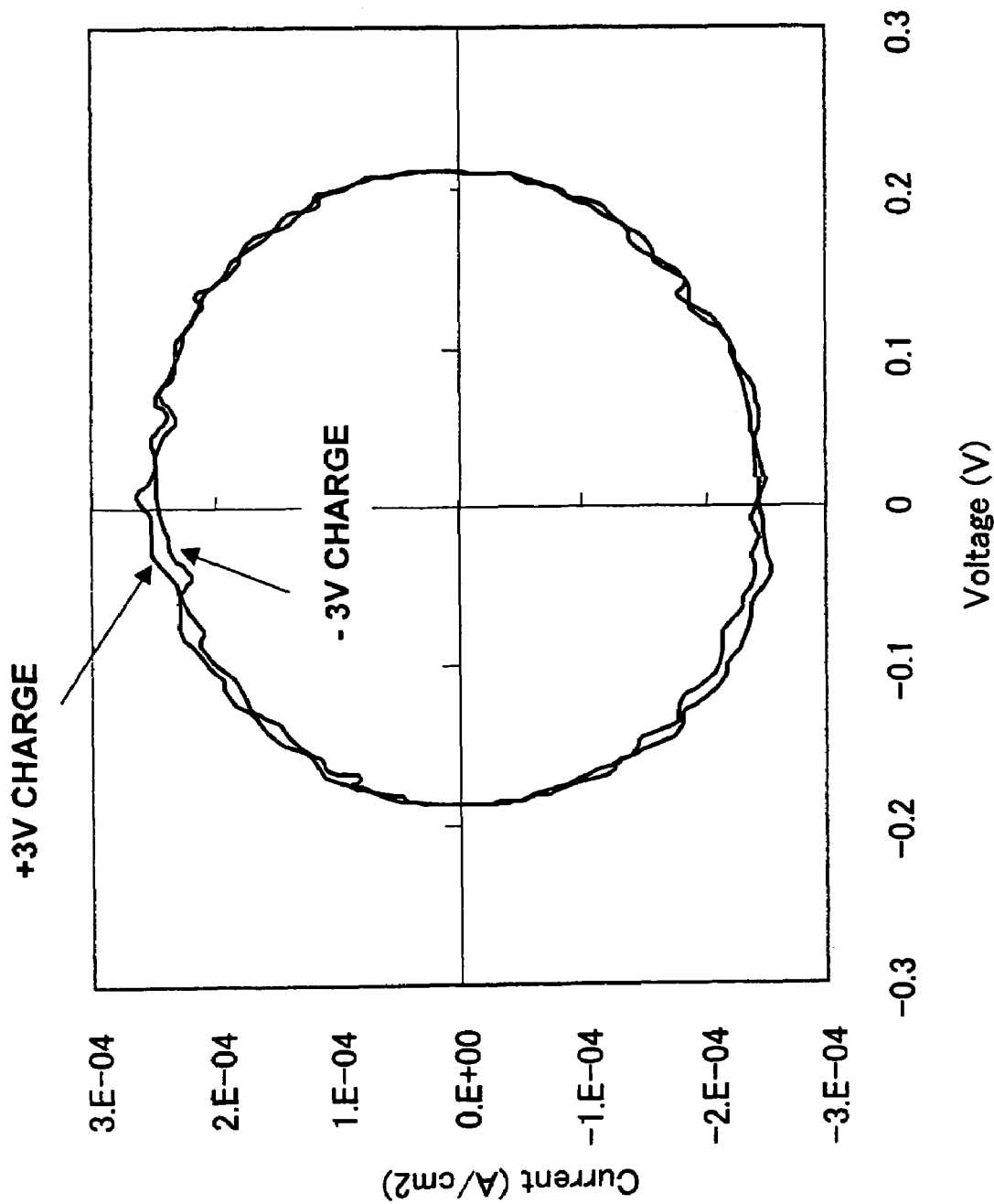
FIG. 30 is a diagram showing that, when an attempt is made to directly take out a difference from a response signal by a comparison method, and a minute voltage is applied to a ferroelectric thin film, an identical minor loop is drawn in the second cycle and thereafter.

The above may be caused as follows. When a minute voltage is applied to the ferroelectric thin film, differences in polarization appear in the shape of a minor loop only in the first cycle (FIG. 29), but an identical minor loop is drawn after the second cycle (FIG. 30), such that a difference disappears with respect to the main information such as the linear dielectric constant between "1" and "0" (the nonlinear dielectric constant is less than 1/1000 of the linear dielectric constant). FIG. 30 shows the measured minor loop, which is in a symmetrical circular shape about the center. This indicates that the nondestructive readout methods in prior applications, such as, the method in which a difference in differential permittivities is read out by applying a pulse below Vc according to Japanese Laid-open Patent Application HEI 5-55664, the method in which the phase of a second harmonic component of a current response is detected by applying a bipolar pulse below Vc according to Japanese Laid-open Patent Application HEI 5-129622, and the method in which the phase of a second harmonic component of a current response is detected by applying a bipolar pulse below Vc according to Japanese Laid-open Patent Application HEI 6-275062 are not established.

In view of the above, by using the present invention, a nondestructive reading can be performed without being restricted by the problems, such as, the smallness of the difference between "1" and "0" which becomes problematical at the time of nondestructive readout, the reduction of difference with cycles, or the like. In addition, although the reduction of reading margin ΔQ becomes a problem along with the reduction of the size of the ferroelectric element in the ordinary readout method, the method according to the present invention uses $\Delta C/C \propto \Delta f/f$ for the readout rule based on the relation of $f=1/(2\pi\sqrt{(LC)})$, such that the influence of the size reduction of a ferroelectric element is smaller than the ordinary art, and therefore is advantageous for higher integration.

What is claimed is:

1. A method for conducting a nondestructive readout of a ferroelectric memory device, comprising:
receiving a readout pulse at a ferroelectric memory device;
resonating the readout pulse at the ferroelectric memory device, the resonating being with a resonance frequency by a resonant circuit provided at a readout side of the ferroelectric memory device;

comparing the readout pulse and the resonated readout pulse at a phase difference detection circuit; and retrieving data from the resonated readout pulse based on the comparison, wherein the resonance frequency at an arbitrary time is converted to a response signal, and the data is retrieved.

2. The method according to claim 1, wherein the pulse applied is one of a sine wave, a triangular wave and a square wave in one of a monopolar and a bipolar format, and has a pulse amplitude of a coercive voltage or less.

3. The method according to claim 1, wherein the ferroelectric memory device has a capacity and a resonance frequency, and when the capacity changes, the resonance frequency changes, and data thereof is retrieved.

4. The method according to claim 1, wherein, when data is stored by using ferroelectric polarization states, and when a first modulation is generated as a reflection of one of the polarization states, and a second modulation is generated reflecting the opposite polarization state, the first modulation and the second modulation have mutually opposite polarities.

5. A method for conducting a nondestructive readout of a ferroelectric memory device, comprising:

receiving a readout pulse at a ferroelectric memory device;

resonating the readout pulse at the ferroelectric memory device, the resonating being with a resonance frequency by a resonant circuit provided at a readout side of the ferroelectric memory device;

comparing the readout pulse and the resonated readout pulse at a phase difference detection circuit; and retrieving data from the resonated readout pulse based on the comparison, wherein responses from two memory elements are mixed to provide 1-bit data.

6. A method for conducting a nondestructive readout of a ferroelectric memory device, comprising:

receiving a readout pulse at a ferroelectric memory device;

resonating the readout pulse at the ferroelectric memory device, the resonating being with a resonance frequency by a resonant circuit provided at a readout side of the ferroelectric memory device;

comparing the readout pulse and the resonated readout pulse at a phase difference detection circuit; and retrieving data from the resonated readout pulse based on the comparison, wherein the ferroelectric memory device does not have a selection transistor having a structure in which one-bit data is stored in two ferroelectric capacitors of identical capacities that are connected in series across a word line traversing a center of a first bit line and a second bit line extending in parallel with each other.

7. The method according to claim 5, wherein the two memory elements include an element for storage and an element for reference.

8. The method according to claim 5, wherein responses from the two memory cells are mixed, and then read out simultaneously.

9. The method according to claim 5, wherein Pb (Zr, Ti, Nb) $O_3$ is used as the ferroelectric.

* * * * *